United States Patent
Lee et al.

(10) Patent No.: US 11,366,545 B2
(45) Date of Patent: Jun. 21, 2022

(54) DISPLAY DEVICE

(71) Applicant: InnoLux Corporation, Miao-Li County (TW)

(72) Inventors: Kuan-Feng Lee, Miao-Li County (TW); Yuan-Lin Wu, Miao-Li County (TW); Yu-Hsien Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/130,172

(22) Filed: Dec. 22, 2020

(65) Prior Publication Data

US 2021/0109624 A1 Apr. 15, 2021

Related U.S. Application Data

(63) Continuation of application No. 16/554,685, filed on Aug. 29, 2019, now abandoned, which is a (Continued)

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01); (Continued)

(58) Field of Classification Search
None
See application file for complete search history.

(56) References Cited

U.S. PATENT DOCUMENTS 9,978,823 B2  5/2018  Ha et al.
2014/0002370 A1* 1/2014 Konvisser ............. G06F 1/1626
345/173

(Continued)

FOREIGN PATENT DOCUMENTS

CN  104600091 A  5/2015
CN  106293202 A  1/2017

OTHER PUBLICATIONS

Chinese language office action dated Sep. 25, 2020, issued in application No. CN 201810413284.5.
(Continued)

*Primary Examiner* — Chad M Dicke
(74) *Attorney, Agent, or Firm* — McClure, Qualey & Rodack, LLP

(57) ABSTRACT

A display device is provided. The display device includes a substrate having a first edge and a second edge opposite to the first edge. There is a first distance between the first edge and the second edge. The display device also includes a plurality of light-emitting units disposed on the substrate, and a conductive line disposed on the substrate and electrically connected to at least one of the plurality of light-emitting units. The conductive line includes an undulating edge and has an extending length which is greater than or equal to half of the first distance and is less than or equal to the first distance.

20 Claims, 19 Drawing Sheets

Related U.S. Application Data continuation of application No. 15/670,120, filed on Aug. 7, 2017, now abandoned.

(60) Provisional application No. 62/500,539, filed on May 3, 2017.

(51) Int. Cl.
*H01L 27/32* (2006.01)
*H05K 1/18* (2006.01)
*H01L 25/075* (2006.01)

(52) U.S. Cl.
CPC .......... *H01L 25/075* (2013.01); *H01L 27/323* (2013.01); *H05K 1/189* (2013.01)

(56) References Cited

U.S. PATENT DOCUMENTS

| | | | |
|---|---|---|---|
| 2014/0184944 A1* | 7/2014 | Ma | G02F 1/13338 |
| | | | 349/12 |
| 2017/0053600 A1* | 2/2017 | Kimura | H01L 27/0629 |
| 2017/0090634 A1* | 3/2017 | Yang | G06F 3/047 |
| 2018/0074614 A1* | 3/2018 | Hiraga | G06F 3/0412 |
| 2018/0173923 A1* | 6/2018 | Lee | G06K 9/0004 |
| 2018/0181240 A1* | 6/2018 | Heo | H01L 27/322 |
| 2018/0247985 A1* | 8/2018 | Jeon | H01L 51/0097 |

OTHER PUBLICATIONS

Chinese language office action dated Feb. 26, 2021, issued in application No. CN 201810413284.5.

* cited by examiner

DISPLAY DEVICE

CROSS REFERENCE TO RELATED APPLICATIONS

This application is a Continuation of application Ser. No. 16/554,685, filed Aug. 29, 2019, which is a Continuation of application Ser. No. 15/670,120, filed Aug. 7, 2017, which claims the benefit of provisional Application No. 62/500,539, filed May 3, 2017, the entirety of which are incorporated by reference herein.

BACKGROUND

Technical Field

The disclosure relates to display devices, and in particular to display devices including light-emitting diodes.

Description of the Related Art

As digital technology develops, display devices are becoming more widely used in our society. For example, display devices have been applied in modern information and communication devices such as televisions, notebook computers, desktop computers, mobile phones (e.g., smartphones). In addition, each generation of display devices has been developed to be thinner, lighter, smaller, and more fashionable.

Among the various types of display devices, light-emitting diode (LED) display devices are becoming popular due to the advantages of LEDs which include high efficiency and long lifespans.

However, existing LED display devices have not been satisfactory in every respect. For example, the conductive line or conductive electrode may be easily cracked during the formation of a curved display device).

BRIEF SUMMARY

Some embodiments of the disclosure provide a display device. The display device includes a substrate having a first edge and a second edge opposite to the first edge, wherein there is a first distance between the first edge and the second edge; a plurality of light-emitting units disposed on the substrate; and a conductive line disposed on the substrate and electrically connected to at least one of the plurality of light-emitting units, wherein the conductive line includes an undulating edge, wherein the conductive line has an extending length, and wherein the extending length is greater than or equal to half of the first distance and is less than or equal to the first distance.

Some embodiments of the disclosure provide a display device. The display device includes a substrate; a plurality of light-emitting units disposed on the substrate; and a conductive line disposed on the substrate and electrically connected to at least one of the plurality of light-emitting units, wherein the conductive line includes a plurality of openings.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

DETAILED DESCRIPTION

Figure 1A:
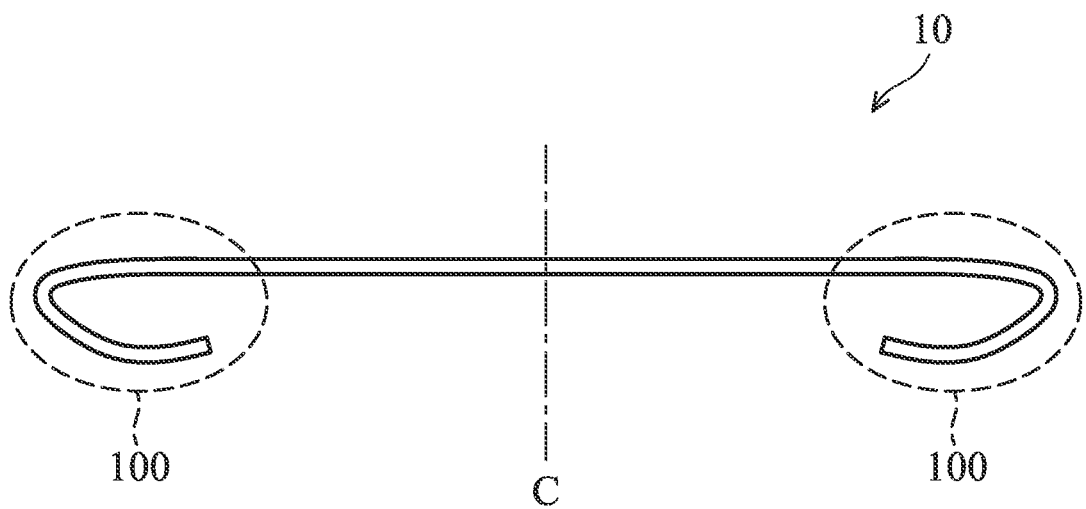
FIG. 1A is a schematic side view of the curved display device 10 according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

FIG. 1A is a schematic side view of the curved display device 10 according to some embodiments of the present disclosure. As shown in FIG. 1A, the curved display device 10 includes one or more curved portions 100. For example, the curved portions 100 can include the end portions of the display device 10. In some embodiments, the curved portions 100 (e.g., two curved portions 100) are symmetrical with respect to the center line C of the curved display device 10 as shown in FIG. 1A.

Figure 1B:
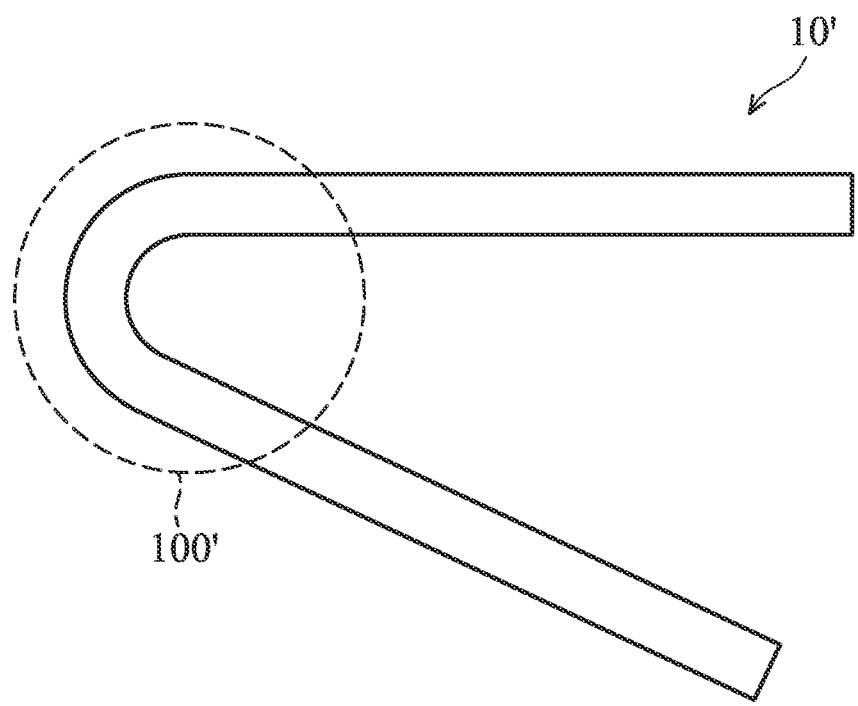
FIG. 1B is a schematic side view of the curved display device 10' according to some embodiments of the present disclosure.

FIG. 1B is a schematic side view of another curved display device 10' according to embodiments of the present disclosure. As shown in FIG. 1B, the curved display device 10' can have curved portion 100' including the center portion of the display device 10'.

It should be noted that the curved display devices (e.g., curved display device 10 or curved display device 10') of some embodiments of the present disclosure can be foldable display devices. However, in other embodiments, the shape of the curved display device is substantially fixed.

First Embodiment

First Embodiment of the present disclosure provides some display devices which can be used to form curved display devices. The conductive lines of the display devices of First Embodiment may have a wavy shape and/or include one or more openings, which may avoid or reduce the formation of cracks in the step of using these display devices to form curved display devices.

Figure 2A:
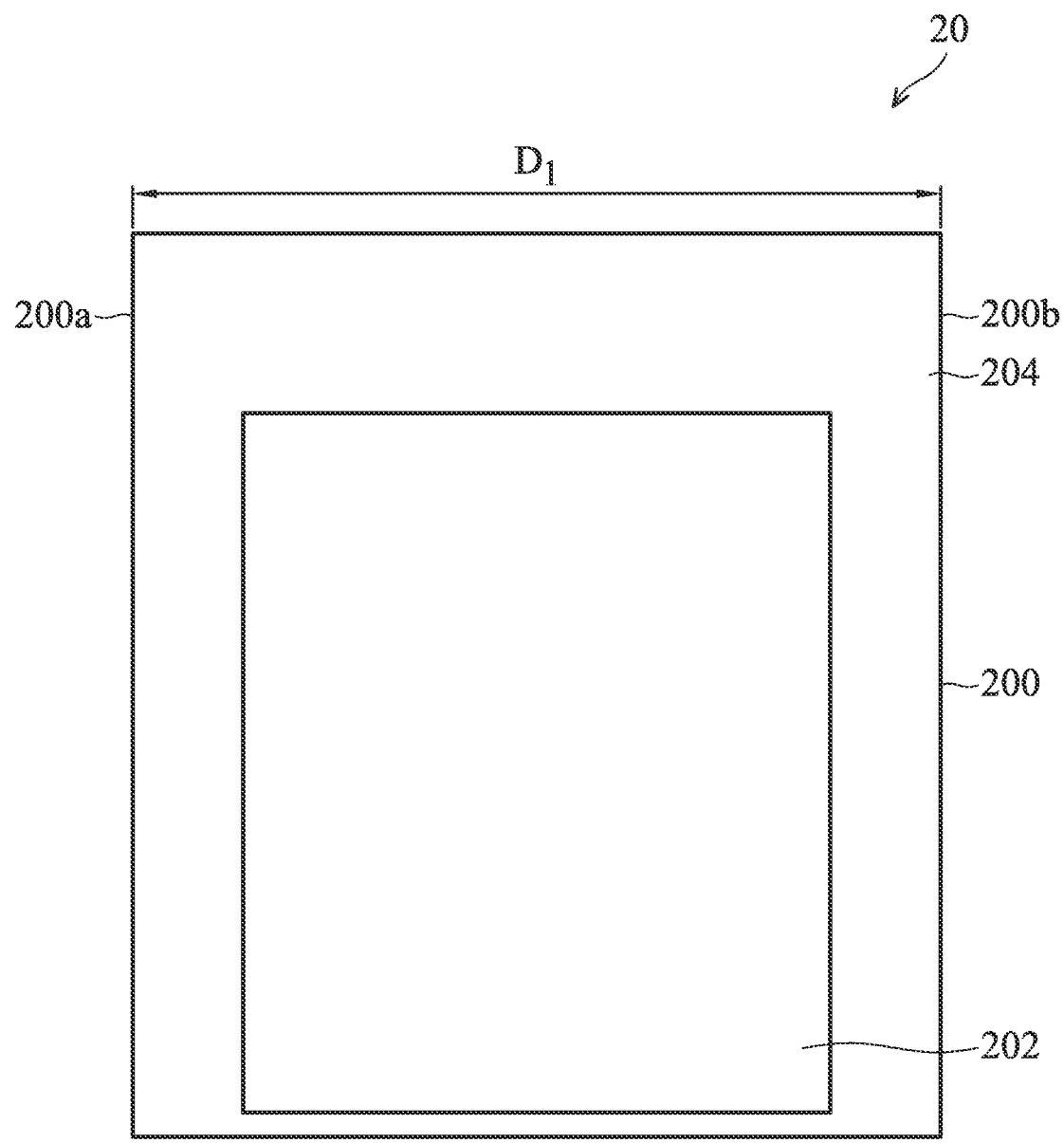
FIG. 2A is a schematic top view of the display device 20 according to First Embodiment of the present disclosure.

FIG. 2A is a schematic top view of the display device 20 according to First Embodiment of the present disclosure. The display device 20 can be used to form a curved display device (e.g., a curved display device with a side view the same as, or similar to the curved display devices 10 or 10' discussed above). For example, the display device 20 can be bent to form a curved display device.

As shown in FIG. 2A, the display device 20 can include a display region 202 and a non-display region 204 adjacent to the display region 202. For example, the non-display region 204 can surround or enclose the display region 202, as shown in FIG. 2A. The display region 202 can refer to the display region in the display device 20 in which the light-emitting units (e.g., light-emitting diodes) are disposed. On the other hand, the non-display region 204 refers to a region other than the display region 202 in the display device 20. For example, an integrated circuit (IC), a demultiplexer (DEMUX), a gate driver on panel (GOP), other applicable devices or components, or a combination thereof may be disposed in the non-display region 204. For example, the devices or components disposed in the non-display region 204 may be electrically connected to the light-emitting units (e.g., light-emitting diodes) disposed in the display region 202 to provide some desired functions (e.g., providing driving signal to the light-emitting units disposed in the display region 202).

As shown in FIG. 2A, the display device 20 includes a substrate 200 having a first edge 200a and a second edge 200b opposite to the first edge 200a. In some embodiments, the first edge 200a and the second edge 200b are substantially parallel to each other and are spaced apart by a first distance $D_1$ (e.g., 5 cm to 10 cm). For example, the substrate 200 of the display device 20 may include polyimide, glass, other applicable materials, or a combination thereof. It should be noted that the elements of the display device 20 formed on the substrate 200 are not shown in FIG. 2A, and will be discussed in the following paragraph.

Figure 2B:
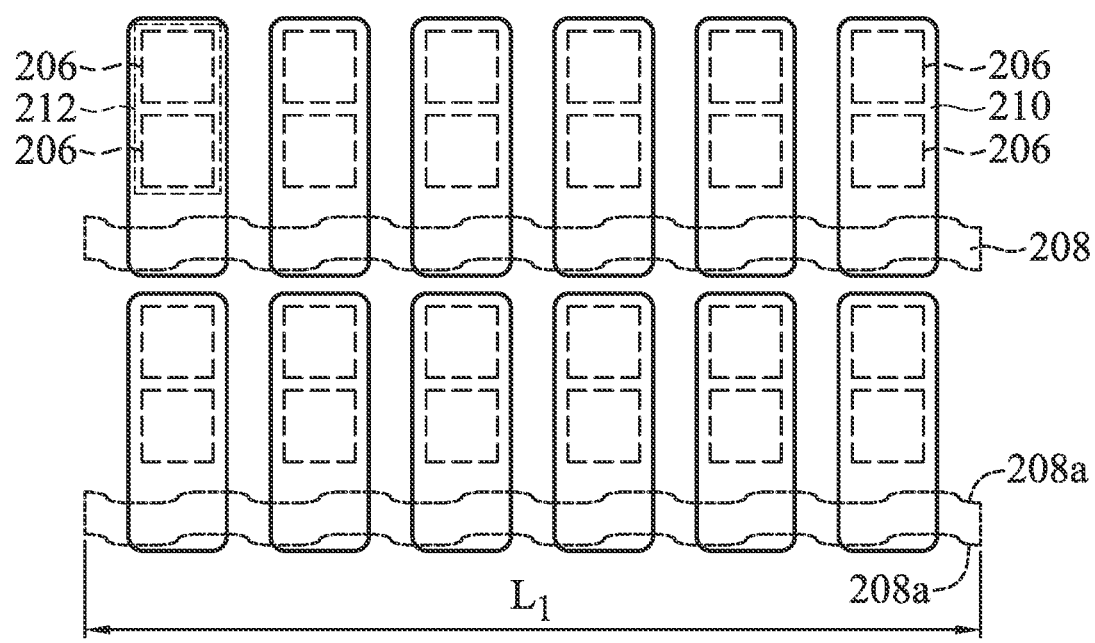
FIG. 2B is a schematic top view of a portion of the display region 202 of the display device 20 according to some embodiments of the present disclosure.

Then, referring to FIG. 2B, a schematic top view of a portion of the display region 202 of the display device 20 is illustrated. As shown in FIG. 2B, the display region 202 can include a plurality of light-emitting units 206 (e.g., light-emitting diodes), one or more conductive lines 208, and one or more conductive electrodes 210.

In this embodiment, a sub-pixel 212 has two light-emitting units 206 (e.g., light-emitting diodes). However, the sub-pixel 212 may have less or more than two light-emitting units 206 with the same color in other embodiments. In some embodiments, adjacent sub-pixels 212 (e.g., three sub-pixels 212) can form a pixel. For example, the pixel can include sub-pixels 212 containing light-emitting units 206 of different colors (e.g., red, green, blue, or a combination thereof).

For example, the material of the conductive electrodes 210 can include, but is not limited to, indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), metal, or a combination thereof. For example, the material of the conductive lines 208 can include, but is not limited to, indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), metal, or a combination thereof. For example, the conductive electrodes 210 and the conductive lines 208 may be respectively formed by a deposition process followed by a lithography process and an etching process.

In some embodiments, the conductive line 208 can be a common line, the conductive electrode 210 can be a common electrode, and the conductive line 208 can be electrically connected to at least one of the light-emitting units 206 through the conductive electrode 210.

In some embodiments, the one or more conductive electrodes 210 can be disposed on the one or more conductive lines 208 and the plurality of light-emitting units 206. In other words, the one or more conductive lines 208 and the plurality of light-emitting units 206 can be disposed between the substrate 200 and the one or more conductive electrodes 210.

In some embodiments, the conductive line 208 may have a wavy shape. For example, as shown in FIG. 2B, the conductive line 208 may include an undulating edge 208a (e.g., an undulating edge extending along a direction substantially perpendicular to the first edge 200a and/or the second edge 200b of the substrate 200), and thus the formation of cracks in the conductive line 208 during the step of forming a curved display device (e.g., bending the display device 20 to form a curved display device) may be avoided or reduced.

In some embodiments, as shown in FIG. 2B, the conductive line 208 can extend along a direction substantially perpendicular to the first edge 200a and/or the second edge 200b of the substrate 200 (referring to FIG. 2A), and an extending length $L_1$ (e.g., a distance measured in a direction perpendicular to the first edge 200a and/or the second edge 200b of the substrate 200) of the conductive line 208 can be greater than or equal to half of the first distance $D_1$ and be less than or equal to the first distance $D_1$ (i.e., $0.5 D_1 \leq L_1 \leq D_1$). In some embodiments, since the extending length $L_1$ is greater than or equal to half of the first distance $D_1$ and less than or equal to the first distance $D_1$, a better device performance can be obtained.

FIGS. 2C, 2D, 2E, 2F, and 2G illustrate some conductive lines 208 of some embodiments of the present disclosure which also may avoid or reduce the formation of cracks during the step of forming a curved display device.

Figure 2C:
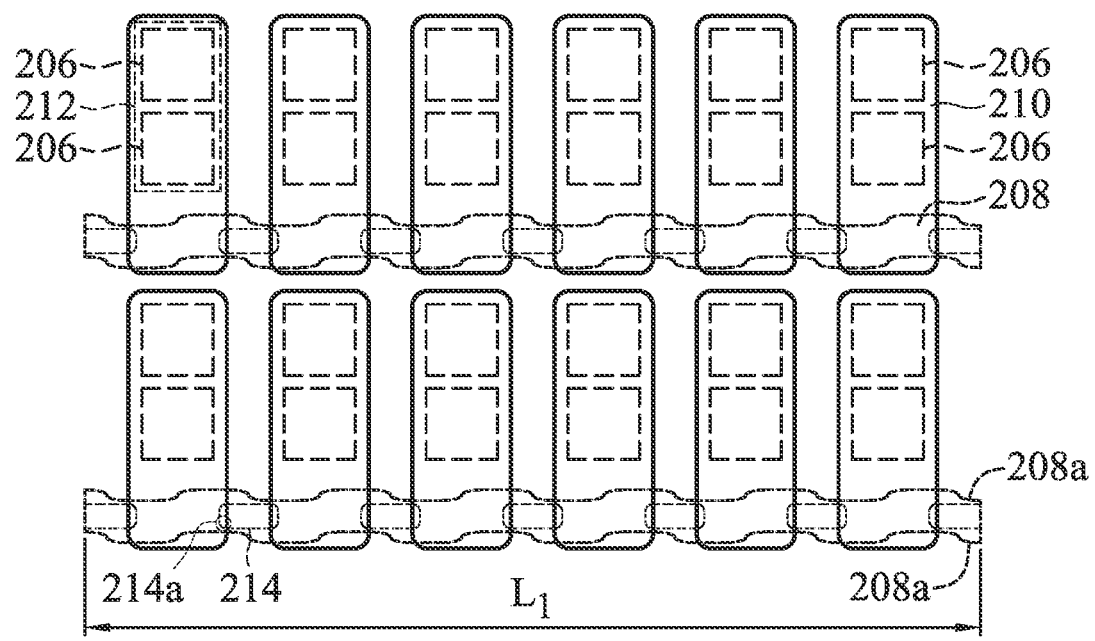
FIG. 2C is a schematic top view of a portion of the display region 202 of the display device 20 according to some embodiments of the present disclosure.

Referring to FIG. 2C, one difference between the embodiments illustrated in FIG. 2C and FIG. 2B is that the conductive line 208 of the embodiments illustrated in FIG. 2C further includes one or more openings 214. For example, a patterning process including a lithography process followed by an etching process may be used to form the one or more openings 214 in the conductive line 208. In some embodiments, the opening 214 may have a shape including a first curved portion 214a (e.g., the round corners of the rectangular opening 214), and thus the mechanical property of the conductive line 208 may be further improved. In other embodiments, the opening 214 may also be substantially oval-shaped (e.g., as shown in FIG. 2D), substantially square, substantially rectangular, substantially round, substantially oblong, substantially triangular, polygon, irregularly-shaped, other applicable shapes, or a combination thereof.

Figure 2D:
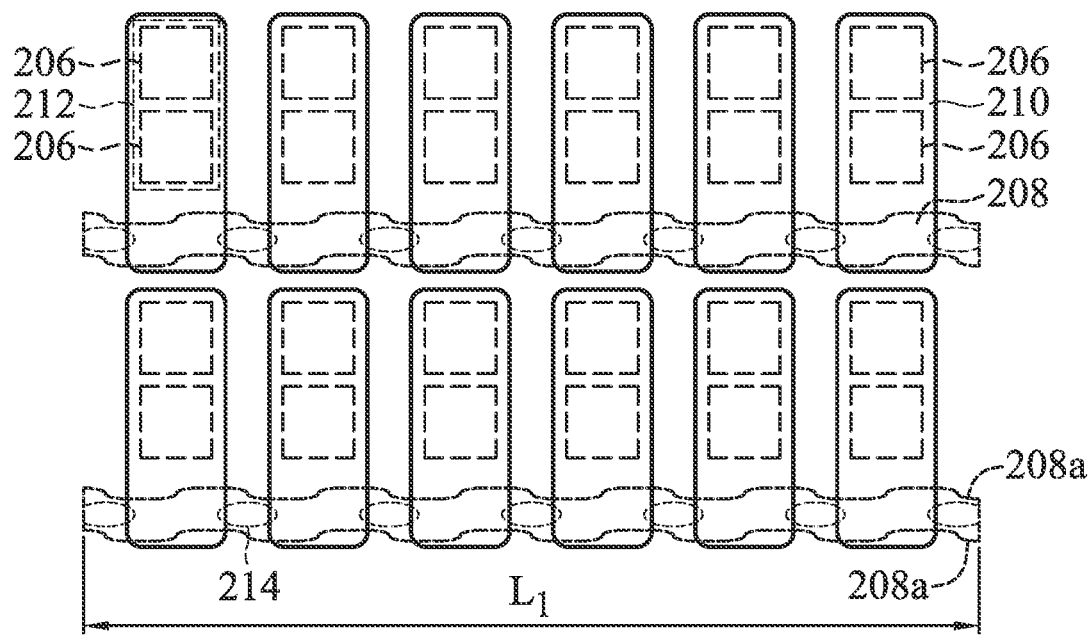
FIG. 2D is a schematic top view of a portion of the display region 202 of the display device 20 according to some embodiments of the present disclosure.
Figure 2E:
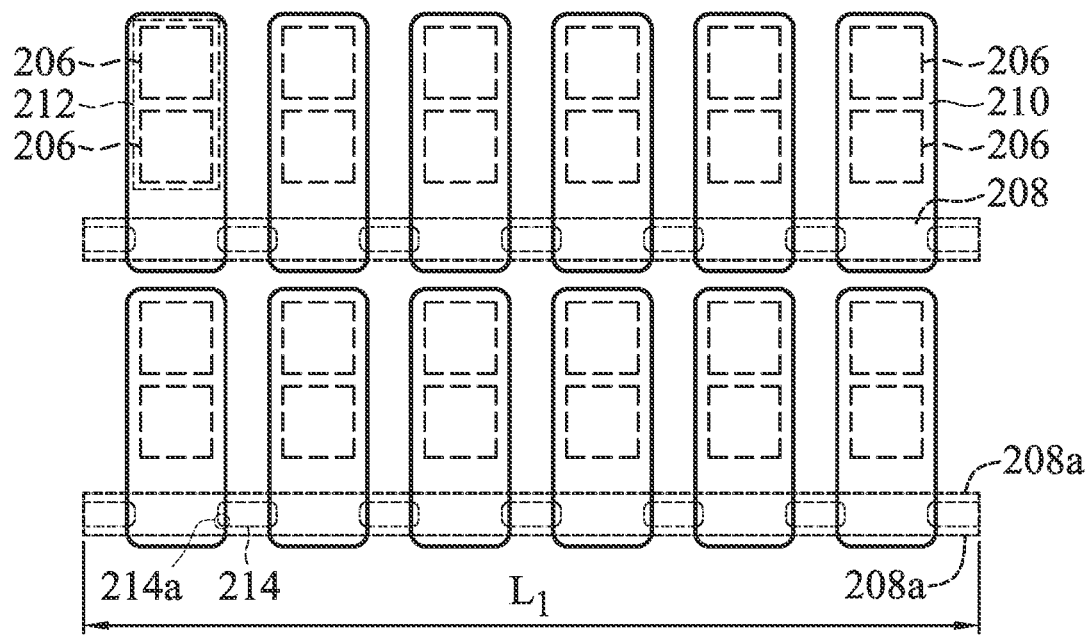
FIG. 2E is a schematic top view of a portion of the display region 202 of the display device 20 according to some embodiments of the present disclosure.

Referring to FIG. 2E, one difference between the embodiments illustrated in FIG. 2C and FIG. 2E is that the conductive line 208 of the embodiments illustrated in FIG. 2E includes a substantially straight edge 208a (e.g., a straight edge extending along a direction substantially perpendicular to the first edge 200a and/or the second edge 200b of the substrate 200). Notably, the opening 214 of the embodiments illustrated in FIG. 2E may also be substantially oval-shaped, substantially square, substantially rectangular, substantially round, substantially oblong, substantially triangular, polygon, irregularly-shaped, other applicable shapes, or a combination thereof.

In some embodiments, as shown in FIGS. 2C, 2D, and 2E, the one or more openings 214 may be located between adjacent conductive electrodes 210.

Figure 2F:
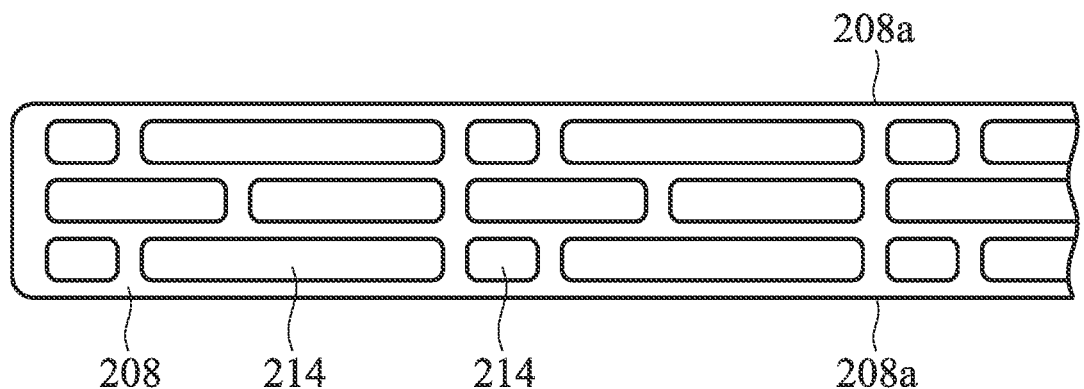
FIG. 2F is a schematic top view of a portion of the conductive line 208 according to some embodiments of the present disclosure.

In some embodiments, as shown in FIG. 2F, a single conductive line 208 may include a plurality of openings 214 having different shapes or sizes to increase design flexibility.

Figure 2G:
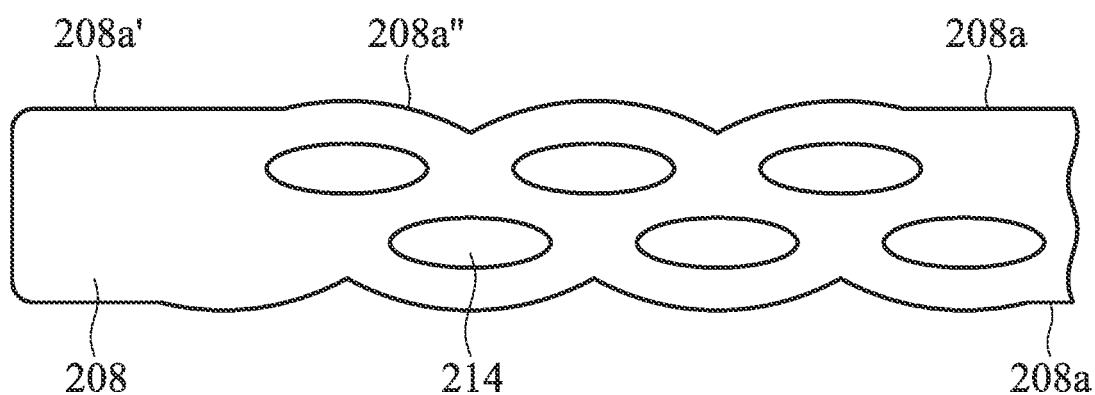
FIG. 2G is a schematic top view of a portion of the conductive line 208 according to some embodiments of the present disclosure.

In some embodiments, as shown in FIG. 2G, the conductive line 208 may have a partially undulating edge 208a. For example, the edge 208a of the conductive line 208 may include a substantially straight portion 208a' and a wavy portion 208a", where the wavy portion is provided at weak points that are prone to cracking.

Figure 2H:
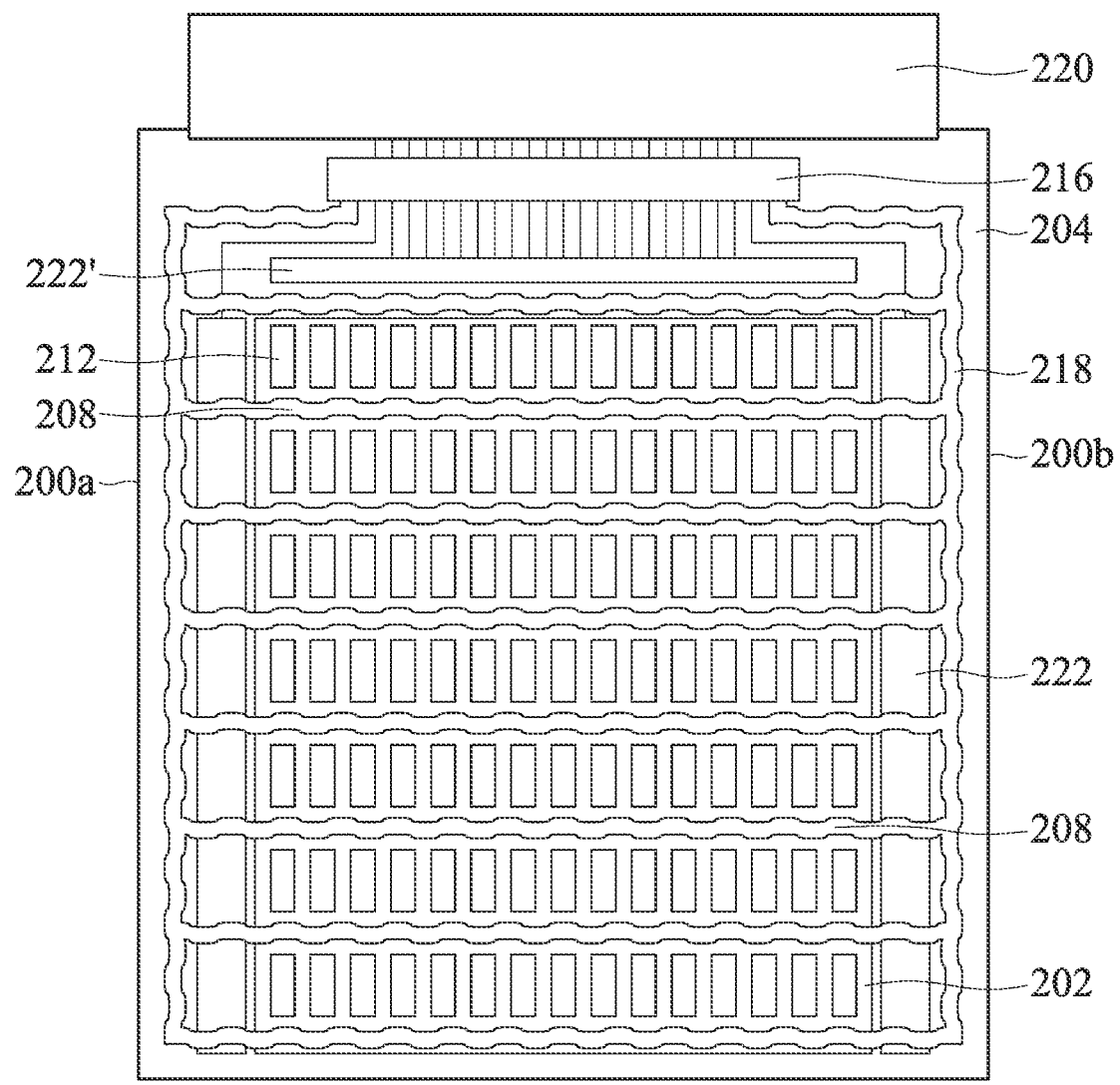
FIG. 2H is a schematic top view of the display device 20 according to some embodiments of the present disclosure.

In some embodiments, the conductive lines 208 are common lines that can be used to transmit common signals from an IC disposed in the non-display region 204 of the display device 20 to the light-emitting units 206 disposed in the display region 202 of the display device 20. For example, as shown in FIG. 2H, the common signals can be transmitted from an IC 216 into the display region 202 of the display device 20 through the common lines 208 in a direction substantially perpendicular to the first edge 200a and/or the second edge 200b of the substrate 200. As shown in FIG. 2H, the common lines 208 may be electrically connected to the IC 216 through another common line 218 disposed in the non-display region 204 of the substrate 200. In some embodiments, the common line 218 may also have a wavy shape, and/or include a plurality of openings as do the common lines 208 discussed above. In some embodiments, the common line 218 and the common lines 208 may be disposed in different layers, and in such cases one or more vias may be used to electrically connect the common line 218 to the common lines 208. In some embodiments, the common line 218 and the common lines 208 may be disposed in the same layer, and the common line 218 and the common lines 208 may be formed by a same process (e.g., deposition, lithography, etching, other applicable processes, or a combination thereof). As shown in FIG. 2H, a demultiplexer (DEMUX) 222' electrically connected to the IC 216, and a gate driver on panel 222 electrically connected to the IC 216 may also be disposed in the non-display region 204 of the display device 20. In addition, as shown in FIG. 2H, the IC 216 may be electrically connected to a printed circuit board 220.

Figure 2I:
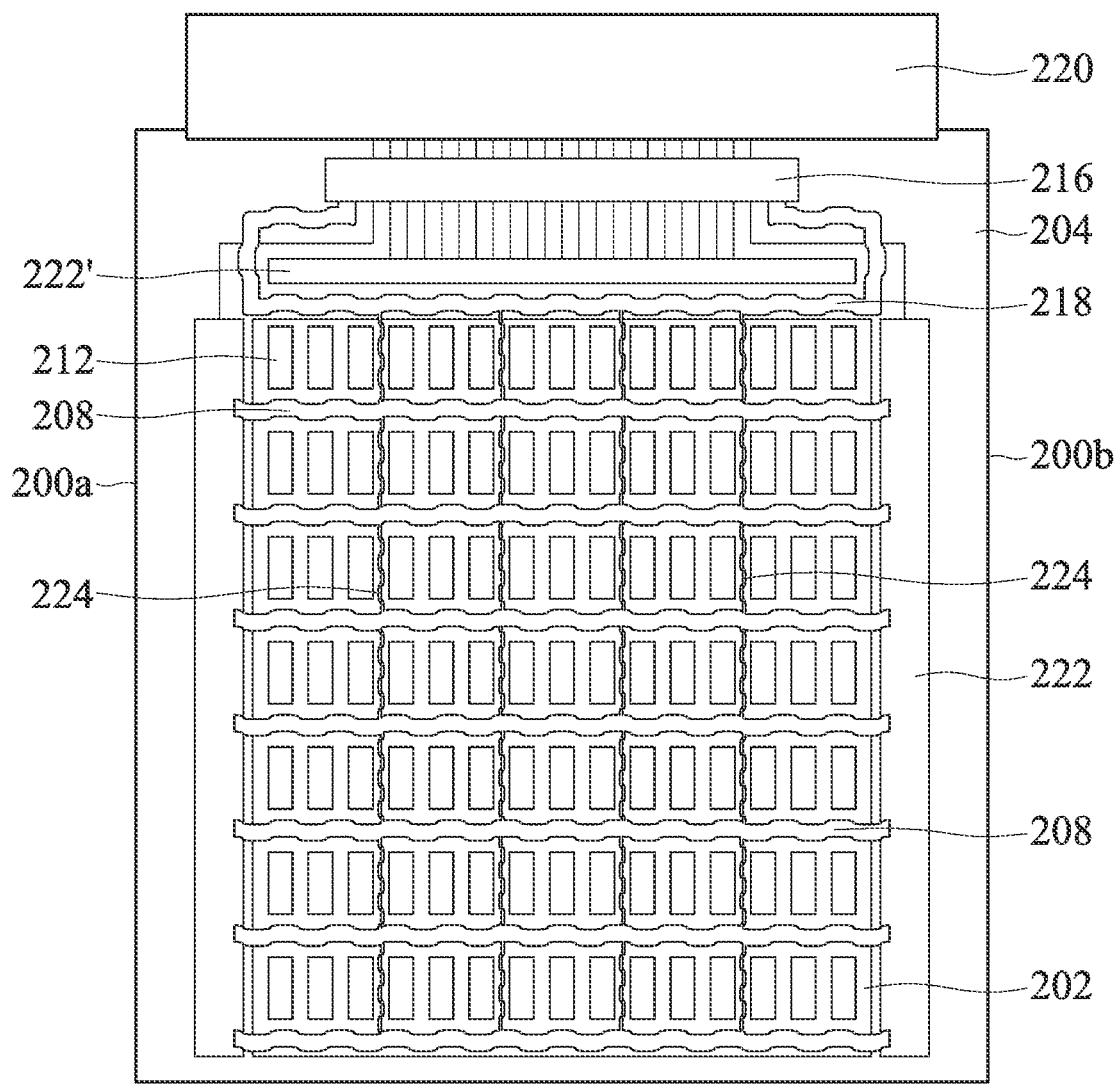
FIG. 2I is a schematic top view of the display device 20 according to some embodiments of the present disclosure.

In some embodiments, as shown in FIG. 2I, the common signals can be transmitted from the IC 216 into the display region 202 of the display device 20 through common lines 224 extending along a direction substantially parallel to the first edge 200a and/or the second edge 200b of the substrate 200, and thus the common signals are transmitted into the display region 202 of the display device 20 in the direction substantially parallel to the first edge 200a and/or the second edge 200b. In some embodiments, the common lines 224 may also have a wavy shape, and/or include a plurality of openings as do the common lines 208 discussed above.

Figure 2J:
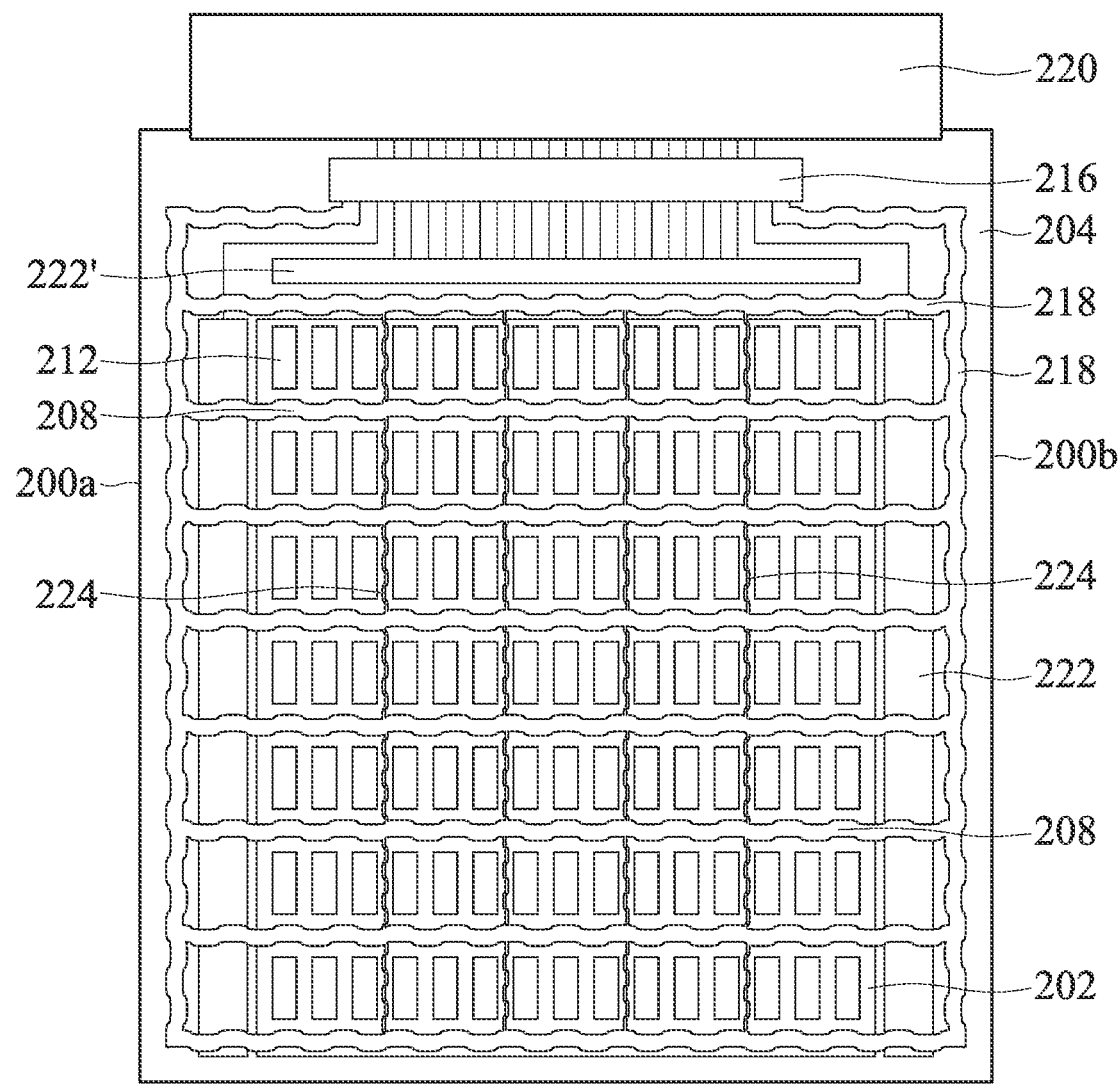
FIG. 2J is a schematic top view of the display device 20 according to some embodiments of the present disclosure.

In some embodiments, as shown in FIG. 2J, the common signals can be transmitted into the display region 202 of the display device 20 through both the common lines 208 extending along a direction that is substantially perpendicular to the first edge 200a and/or the second edge 200b of the substrate 200, and the common lines 224 extending along a direction that is substantially parallel to the first edge 200a and/or the second edge 200b of the substrate 200. In other words, the common signals can be transmitted into the display region 202 of the display device 20 in two directions substantially perpendicular to each other.

Understandably, FIGS. 2H, 2, and 2J are schematic top views of some display devices according to some embodiments of the present disclosure, and the elements illustrated in these FIGS. may be disposed in the same layer or in different layers.

It should be noted that the curved display devices formed of the display devices of the above embodiments may include technical features which are the same as or similar to the technical features of the display devices of the above embodiments. For example, the conductive lines may still have a wavy shape and/or include one or more openings in the curved display devices formed of the display devices of the above embodiments. These curved display devices are intended to be included within the scope of the present disclosure.

Second Embodiment

Figure 3A:
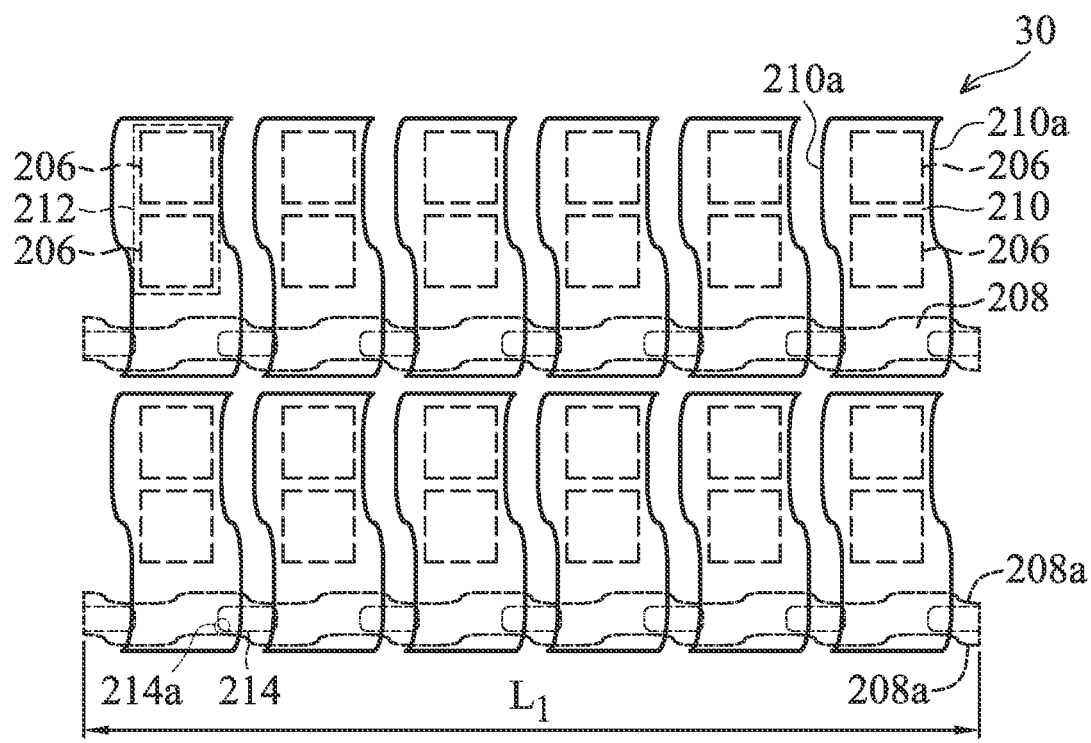
FIG. 3A is a schematic top view of a portion of the display region 202 of the display device 30 according to Second Embodiment of the present disclosure.

FIG. 3A is a schematic top view of a portion of the display region 202 of the display device 30 according to Second Embodiment of the present disclosure. One difference between Second Embodiment and the above embodiments is that the one or more conductive electrodes 210 (e.g., a common electrode) may have a wavy shape and/or include one or more openings, which may avoid or reduce the formation of cracks in the one or more conductive electrodes during the step of forming a curved display device (e.g., bending the display device 30 to form a curved display device).

As shown in FIG. 3A, the conductive electrode 210 may have a wavy shape. For example, as shown in FIG. 3A, the conductive electrode 210 may include an undulating edge 210a (e.g., an undulating edge extending along a direction substantially parallel to the first edge 200a and/or the second edge 200b of the substrate 200).

Figure 3B:
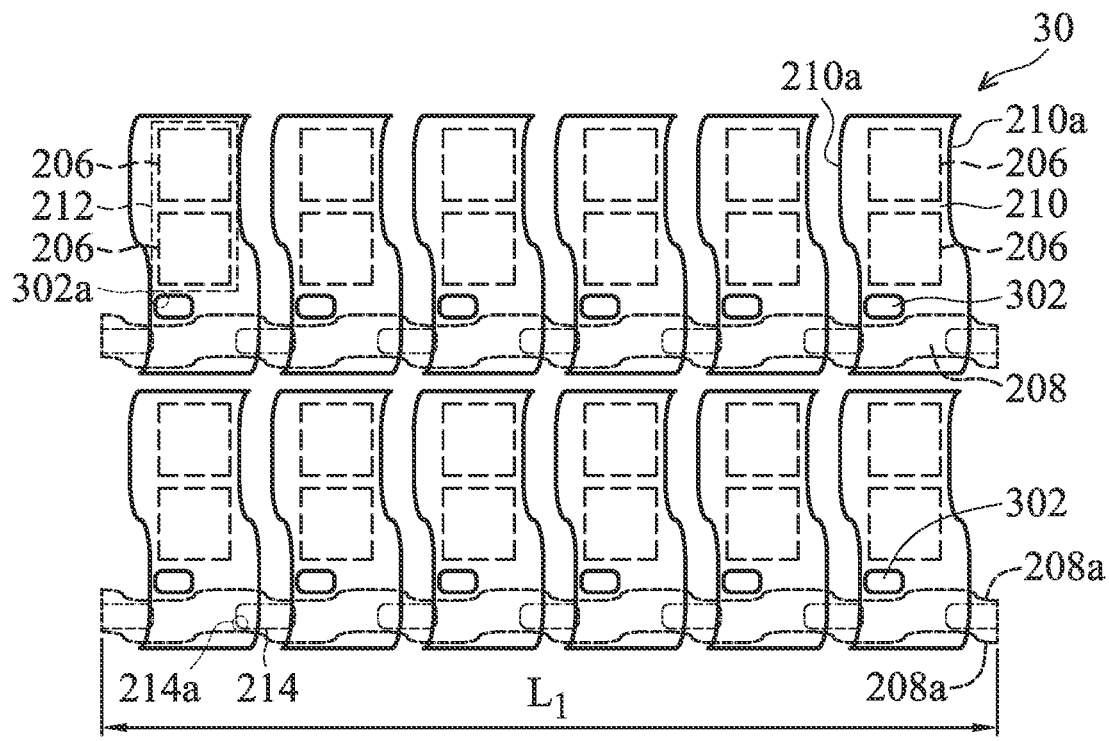
FIG. 3B is a schematic top view of a portion of the display region 202 of the display device 30 according to some embodiments of the present disclosure.

In some embodiments, as shown in FIG. 3B, the conductive electrode 210 may have one or more openings 302. For example, a patterning process including a lithography process followed by an etching process may be used to form the one or more openings 302 in the conductive electrode 210. In some embodiments, the opening 302 may have a shape including a first curved portion 302a (e.g., the round corners of the rectangular opening 302), and thus the mechanical property of the conductive electrode 210 may be further improved. In other embodiments, the opening 302 may also be substantially oval-shaped, substantially square, substantially rectangular, substantially round, substantially oblong, substantially triangular, polygon, irregularly-shaped, other applicable shape, or a combination thereof.

In some embodiments, as shown in FIG. 3B, the area of one of the openings 302 is smaller than the area of one of the light-emitting units 206 (e.g., the area of the bottom surface or top surface of one of the light-emitting diodes 206), and thus the mechanical property of the conductive electrode 210 may be further improved.

Figure 3C:
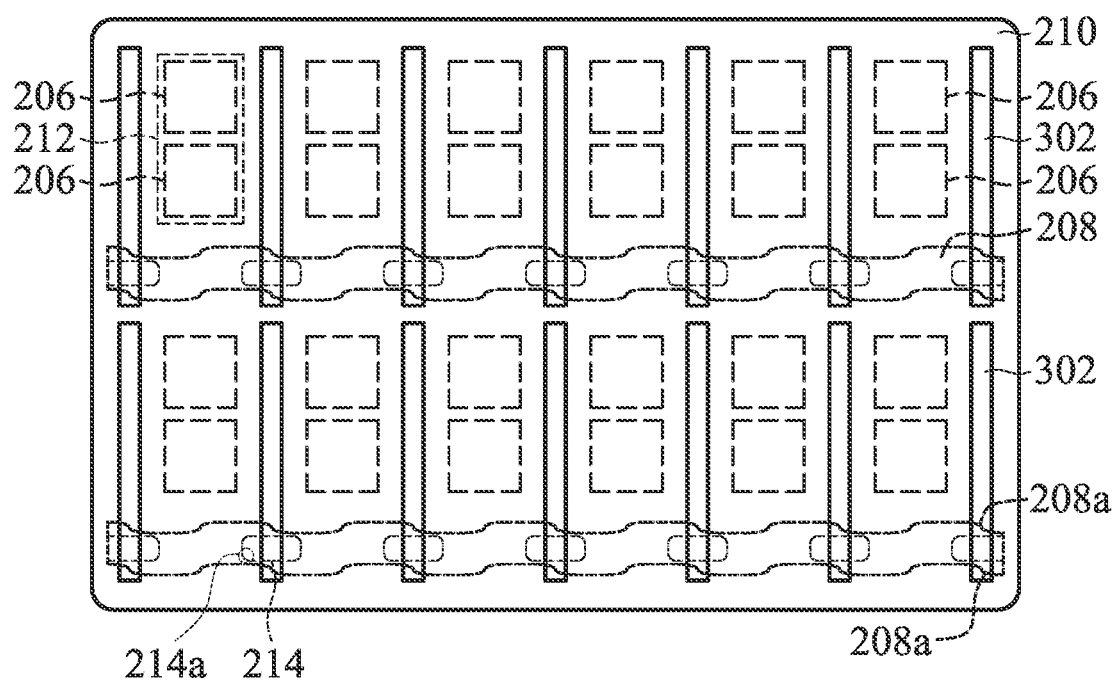
FIG. 3C is a schematic top view of a portion of the display region 202 of the display device 30 according to some embodiments of the present disclosure.

In some embodiments, as shown in FIG. 3C, a single bulk conductive electrode 210 including a plurality of openings 302 can be provided. In addition, the single conductive electrode 210 may cover a plurality of sub-pixels 212.

In some embodiments, as shown in FIGS. 3A, 3B, and 3C, the light-emitting units 206 are fully covered by the conductive electrodes 210.

Figure 3D:
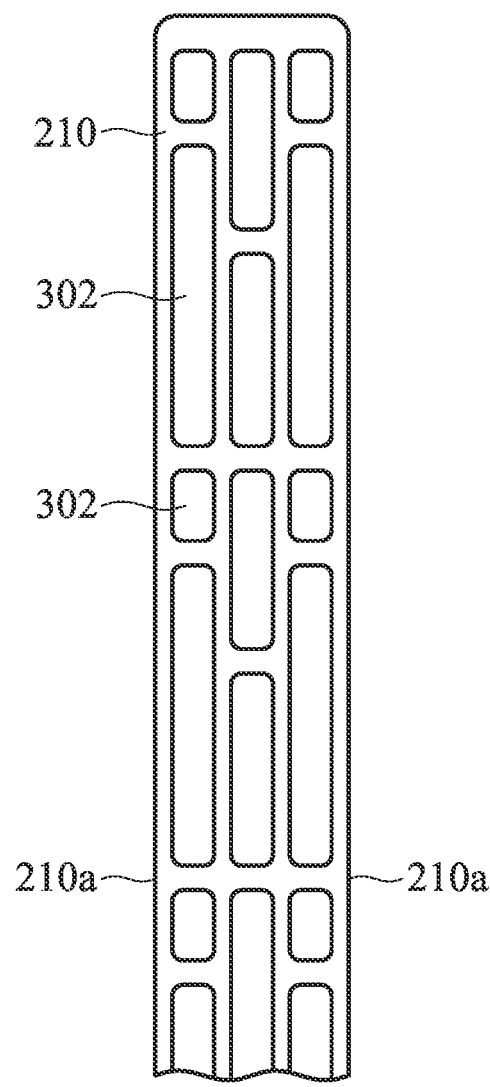
FIG. 3D is a schematic top view of a portion of the conductive electrode 210 according to some embodiments of the present disclosure.
Figure 3E:
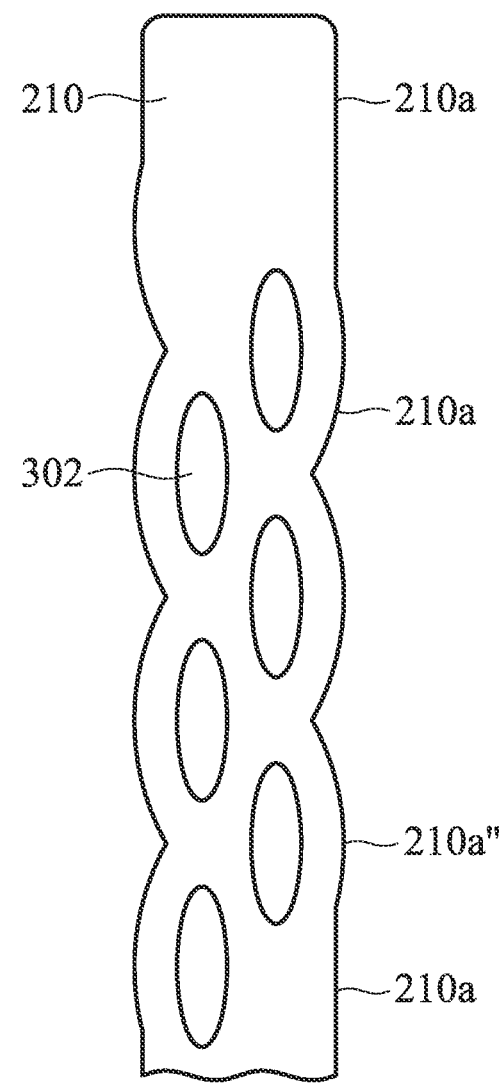
FIG. 3E is a schematic top view of a portion of the conductive electrode 210 according to some embodiments of the present disclosure.

FIGS. 3D and 3E illustrate some conductive electrodes 210 according to some embodiments of the present disclosure which also may avoid or reduce the formation of cracks during the step of forming a curved display device.

In some embodiments, as shown in FIG. 3D, a single conductive electrode 210 may include a plurality of openings 302 having different shapes or sizes to increase design flexibility.

In some embodiments, as shown in FIG. 3E, the conductive electrode 210 may have a partially undulating edge 210a. For example, the edge 210a of the conductive electrode 210 may include a substantially straight portion 210a' and a wavy portion 210a'', where the wavy portion is provided at weak points that are prone to cracking.

In some other embodiments, the design of the conductive electrodes 210 (e.g., the wavy shape, and/or the opening therein) discussed above can be applied to a common electrode, a touch electrode, other conductive electrodes, or a combination thereof of a display device. The details will be discussed in the following paragraph.

Figure 4A:
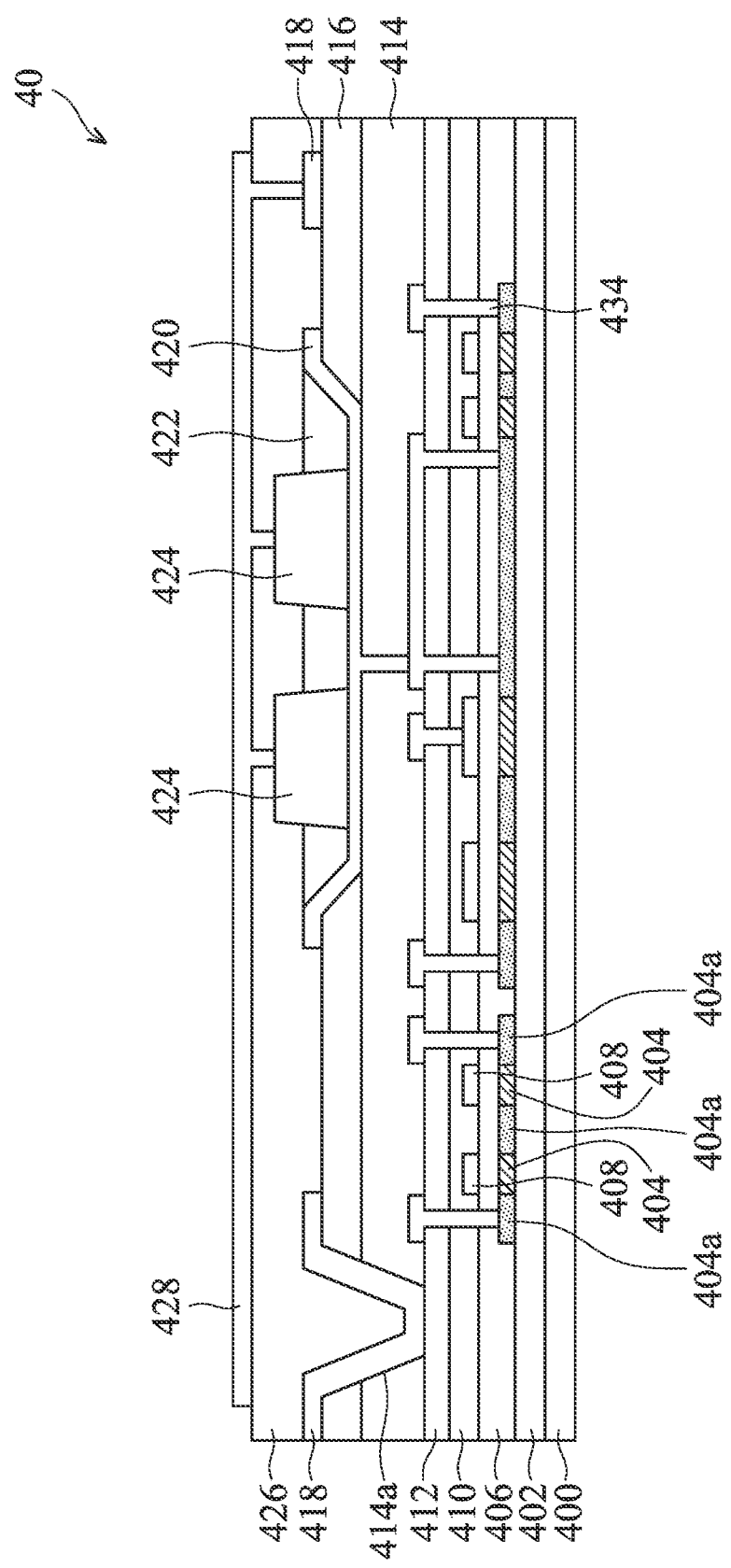
FIG. 4A is a schematic cross-sectional view of the display device 40 according to some embodiments of the present disclosure.

FIG. 4A is a schematic cross-sectional of the display device 40 according to some embodiments of the present disclosure. The display device 40 can be used to form a curved display device (e.g., a curved display device with a side view the same as, or similar to the curved display devices 10 or 10' discussed above). For example, the display device 40 can be bent to form a curved display device.

As shown in FIG. 4A, the display device 40 includes a substrate 400. For example, the substrate 400 can be made of glass, polyimide, other applicable materials, or a combination thereof. A buffer layer 402 may be optionally formed on the substrate 400 to reduce the lattice mismatch. For example, the buffer layer 402 can be made of silicon oxide, silicon nitride, other applicable materials, or a combination thereof. A semiconductor layer 404 may be formed on the buffer layer 402. For example, the semiconductor layer 404 may include one or more doped regions 404a which may serve as source/drain regions. A gate insulator 406 may be formed on the semiconductor layer 404. For example, the gate insulator 406 may be made of silicon oxide, other applicable materials, or a combination thereof. One or more gate electrodes 408 may be formed on the gate insulator 406, and a first insulating layer 410 (e.g., silicon oxide) may be formed on the one or more gate electrodes 408. A second insulating layer 412 may be formed on the first insulating layer 410. For example, the second insulating layer 412 may be made of a material (e.g., silicon nitride) that is different from the material of the first insulating layer 410. A third insulating layer 414 may be formed on the second insulating layer 412. For example, the third insulating layer 414 may be made of silicon nitride, organic materials (e.g., Acrylic based organic material), other applicable insulating materials, or a combination thereof. A pixel defining layer (PDL) 416 may be formed on the third insulating layer 414. For example, the pixel defining layer 416 (e.g. an insulating layer) may be made of photosensitive polyimide, acrylic, siloxane, novolac materials, other applicable materials, or a combination thereof. A reflector 420 may be formed on the pixel defining layer 416. As shown in FIG. 4A, the reflector 420 may extend from a top surface of the pixel defining layer 416 into the pixel defining layer 416 and the third insulating layer 414. For example, the reflector 420 may be made of metal (e.g., Al or Ag), metal alloys (e.g., metal alloys of Al or Ag), other applicable materials, or a combination thereof. One or more light-emitting units 424 (e.g., light-emitting diodes) may be formed on the reflector 420. As shown in FIG. 4A, a filling material may be formed on the reflector 420 and around the one or more light-emitting units 424. For example, the filling material 422 may be made of organic material, anisotropic conductive film (ACF) bonding material, other applicable materials, or a combination thereof. In some embodiments, the filling material can include quantum dots therein. As shown in FIG. 4A, one or more conductive lines 418 may be formed on the pixel defining layer 416. For example, the conductive lines 418 may also have a wavy shape and/or include one or more openings as do the conductive lines 208 discussed above. As shown in FIG. 4A, the display device 40 may also include a fourth insulating layer 426 formed on the conductive lines 418, the light-emitting units 424, and the pixel defining layer 416. For example, the fourth insulating layer 426 may be made of an organic material, inorganic/organic stacked layer (e.g., SiNx/organic/SiNx stacked layer), other applicable insulating materials, or a combination thereof. As shown in FIG. 4A, a conductive electrode 428 which may be configured to electrically connect the conductive line 418 to the light-emitting unit 424 may be formed on the conductive lines 418, the light-emitting units 424, and the fourth insulating layer 426.

As shown in FIG. 4A, one or more conductive structures 434 may be formed in the display device 40 to electrically connect different elements of the display device 40.

In some embodiments, the conductive electrode 428 may include a common electrode, a touch electrode, or a combination thereof. As noted above, the design of the conductive electrodes 210 (e.g., the wavy shape, and/or the opening therein) discussed above can be applied to the conductive electrode 428 (e.g., a common electrode, a touch electrode, or a combination thereof), such that the formation of cracks during the step of forming a curved display device may be avoided or reduced.

Figure 4B:
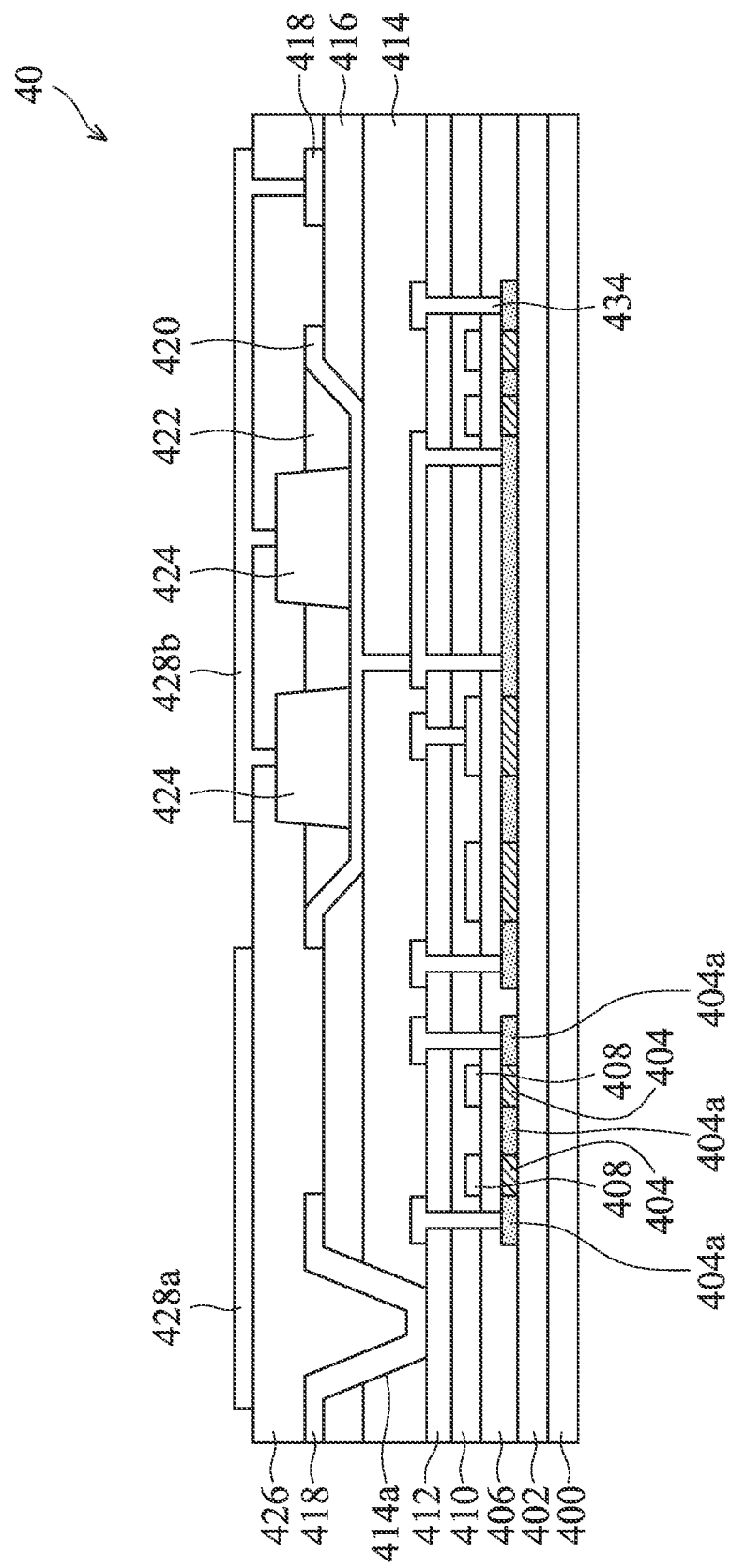
FIG. 4B is a schematic cross-sectional view of the display device 40 according to some embodiments of the present disclosure.

In some embodiments, a single bulk conductive electrode 428 may simultaneously serve as a common electrode and a touch electrode, and thus the route for transmitting common signals and the route for transmitting touch signals may be the same. However, in other embodiments, as shown in FIG. 4B, two conductive electrodes 428a and 428b may respectively serve as a touch electrode and a common electrode, and thus the route for transmitting touch signals and the route for transmitting common signals may be different.

Figure 4C:
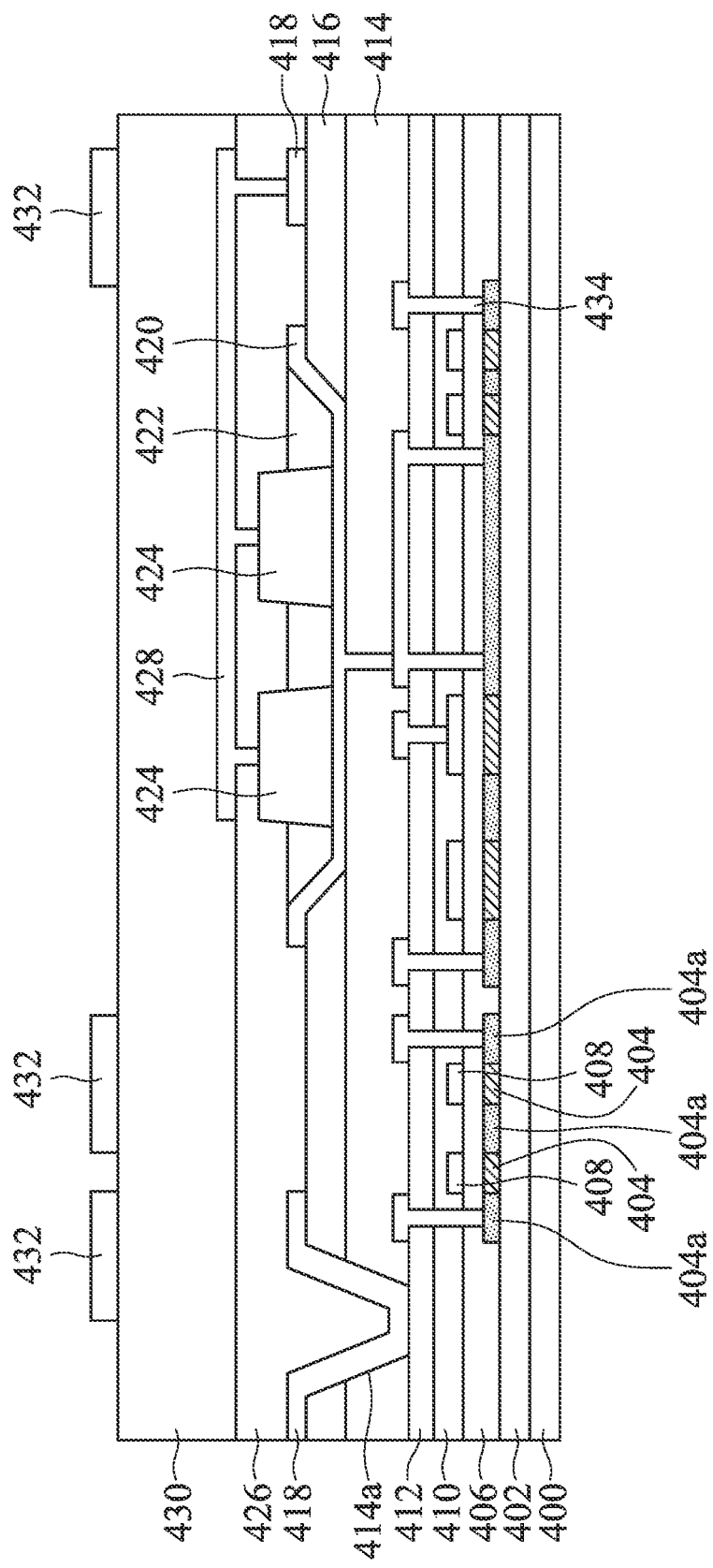
FIG. 4C is a schematic cross-sectional view of the display device 40 according to some embodiments of the present disclosure.

In some embodiments, the touch electrode and the common electrode may be formed in different layers. For example, as shown in FIG. 4C, one or more touch electrodes 432 can be formed on the common electrode 428, and an insulating layer 430 may be formed between the one or more touch electrodes 432 and the common electrode 428. In some embodiments, as shown in FIG. 4C, the one or more touch electrodes 432 and the light-emitting units 424 do not overlap, and thus a better device performance may be obtained.

Notably, more layers of conductive electrodes can be formed on the conductive electrode 428 according to, for example, the application of the display device. For example, more layers of touch electrodes can be formed on the common electrode 428 and the touch electrodes 432 of the display device illustrated in FIG. 4C.

In some embodiments, as shown in FIG. 4A, the insulating layer under the light-emitting units 424 (e.g., insulating layers 414) may include a recess or a trench 414a therein, which may further reduce the formation of cracks in the display device during the step of forming a curved display device.

It should be noted that the curved display devices formed of the display devices of the above embodiments may include technical features that are the same as or similar to the technical features of the display devices of the above embodiments. For example, the conductive electrodes may still have a wavy shape and/or include one or more openings in the curved display devices formed of the display devices of the above embodiments. These curved display devices are intended to be included within the scope of the present disclosure.

Third Embodiment

Figure 5:
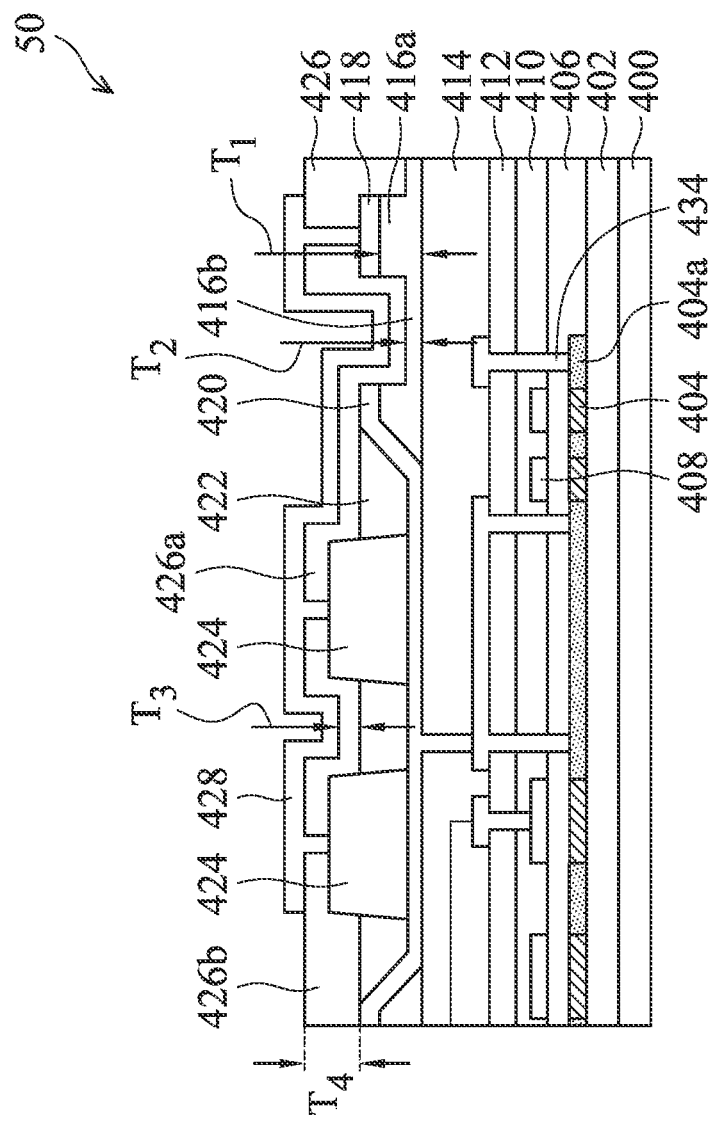
FIG. 5 is a schematic cross-sectional view of the display device 50 according to Third Embodiment of the present disclosure.

FIG. 5 is a schematic cross-sectional of the display device 50 according to Third Embodiment of the present disclosure. The display device 50 can be used to form a curved display device (e.g., a curved display device with a side view the same as, or similar to the curved display devices 10 or 10' discussed above). For example, the display device 50 can be bent to form a curved display device.

The display device 50 may be similar to the display devices of the above embodiments (e.g., the display device 40), and the difference between the display device 50 and the display devices of the above embodiments will be discussed in the following paragraph.

As shown in FIG. 5, the pixel defining layer 416 may include a first portion 416a overlapping with the conductive line 418, and a second portion 416b not overlapping with the conductive line 418. As shown in FIG. 5, the second portion 416b of the pixel defining layer 416 is adjacent to the first portion 416a of the pixel defining layer 416 (e.g. an insulating layer). In some embodiments, a thickness $T_1$ of the first portion 416a can be greater than a thickness $T_2$ of the second portion 416b (e.g., a minimum thickness of the second portion 416b), which may improve the mechanical property of the display device 50 (e.g., avoiding or reducing the formation of cracks in the display device 50 during the step of bending the display device 50 to form a curved display device).

As shown in FIG. 5, the fourth insulating layer 426 may include a first portion 426a overlapping with the conductive electrode 428, and a second portion 426b not overlapping with the conductive electrode 428. As shown in FIG. 5, the second portion 426b of the fourth insulating layer 426 is adjacent to the first portion 426a of the fourth insulating layer 426. In some embodiments, a thickness $T_4$ of the second portion 426b can be greater than a thickness $T_3$ of the first portion 426a (e.g., a minimum thickness of the first portion 426a), which may improve the mechanical property of the display device 50 (e.g., avoiding or reducing the formation of cracks in the display device 50 during the step of bending the display device 50 to form a curved display device).

It should be noted that the curved display devices formed of the display devices of the above embodiments may include technical features which are the same as or similar to the technical features of the display devices of the above embodiments (e.g., the technical features of the insulating layers discussed above. These curved display devices are intended to be included within the scope of the present disclosure.

Fourth Embodiment

Fourth Embodiment of the present disclosure also provides some display devices which may avoid or reduce the formation of cracks in the step of using these display devices to form curved display devices.

Figure 6A:
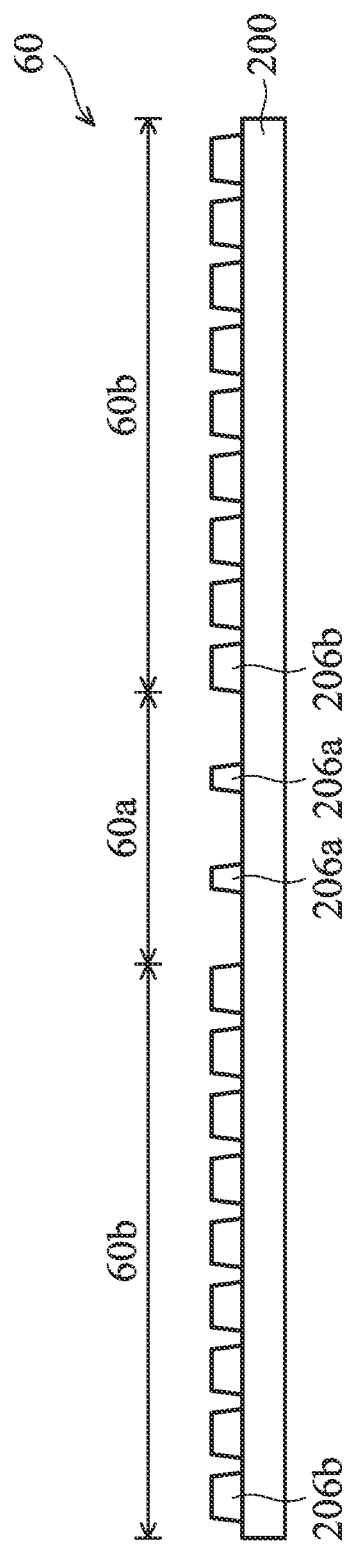
FIG. 6A is a schematic side view of the display device 60 according to Fourth Embodiment of the present disclosure.

Referring to FIG. 6A, a schematic side view of the display device 60 according to Fourth Embodiment of the present disclosure is provided. Although only the substrate 200 and the light-emitting units (e.g., light-emitting diodes) 206a and 206b are shown in FIG. 6A for the interest of simplicity, one skilled in the art can understand that additional layers and/or components discussed in the above embodiments may also be disposed in the display device 60. For example, some insulating layers may be formed between the substrate 200 and the light-emitting units (206a and 206b) of the display device 60, and one or more conductive electrodes may be formed on the light-emitting units 206a and 206b.

For example, the display device 60 can be bent to form a curved display device (e.g., curved display device 10' shown in FIG. 1). As shown in FIG. 6A, the display device 60 can include a portion 60a and a portion 60b. For example, the portion 60a can correspond to a curved portion of a curved display device (e.g., the curved portion 100' of the curved display device 10' illustrated in FIG. 1B) formed of the display device 60, and the portion 60b can correspond to a non-curved portion of the curved display device formed of the display device 60.

In some embodiments, the dimension of one of the light-emitting units 206a in the portion 60a may be smaller than the dimension of one of the light-emitting units 206b in the portion 60b, which may avoid or reduce the formation of cracks in the step of using the display device 60 to form a curved display device. For example, the bottom surface area of one of the light-emitting units 206a may be smaller than the bottom surface area of one of the light-emitting units 206b. In some embodiments, the ratio of the bottom surface area of one of the light-emitting units 206a to the bottom surface area of one of the light-emitting units 206b may be 0.3 to 0.95.

In some embodiments, as shown in FIG. 6A, the density (e.g., number of light-emitting units per unit area) of the light-emitting units 206a in the portion 60a may be smaller than the density of the light-emitting units 206b in the portion 60b, which may avoid or reduce the formation of cracks in the step of using the display device 60 to form a curved display device.

Figure 6B:
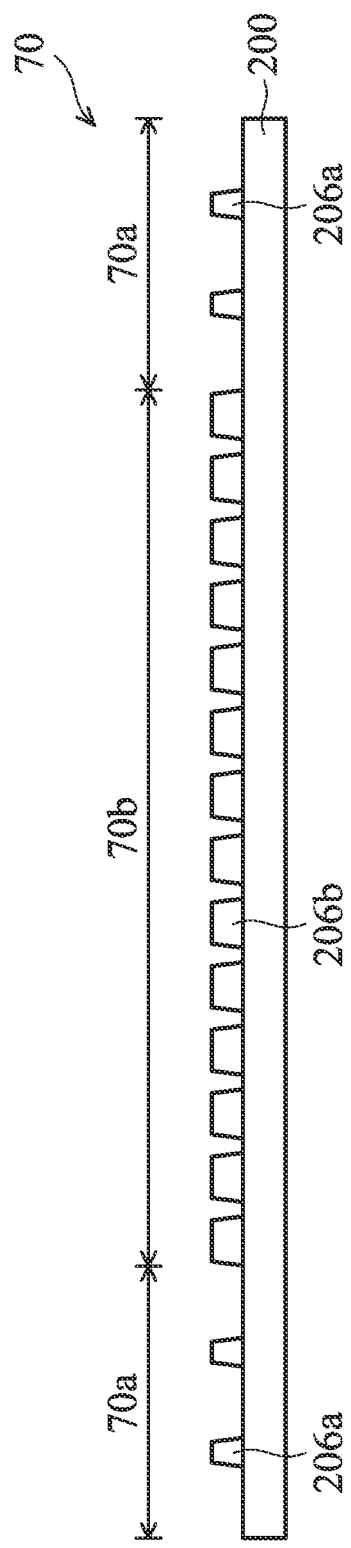
FIG. 6B is a schematic side view of the display device 70 according to an embodiment of the present disclosure.

Referring to FIG. 6B, a schematic side view of the display device 70 according to another embodiment of the present disclosure is provided. Similar to the display device 60, the display device 70 also includes a portion 70a corresponding to the curved portion of the curved display device (e.g., the curved portion 100 of the curved display device 10 illustrated in FIG. 1A) formed of the display device 70, and a portion 70b corresponding to the non-curved portion of the curved display device formed of the display device 70.

In some embodiments, the dimension of one of the light-emitting units 206a in the portion 70a may be smaller than the dimension of one of the light-emitting units 206b in the portion 70b, which may avoid or reduce the formation of cracks in the step of using the display device 70 to form a curved display device. For example, the bottom surface area of one of the light-emitting units 206a may be smaller than the bottom surface area of one of the light-emitting units 206b. In some embodiments, the ratio of the bottom surface area of one of the light-emitting units 206a to the bottom surface area of one of the light-emitting units 206b may be 0.3 to 0.95.

In some embodiments, as shown in FIG. 6B, the density (e.g., number of light-emitting units per unit area) of the light-emitting units 206a in portion 70a may be smaller than the density of the light-emitting units 206b in portion 70b, which may avoid or reduce the formation of cracks in the step of using the display device 70 to form a curved display device.

It should be noted that the curved display devices formed of the display devices of the above embodiments may include technical features which are the same as or similar to the technical features of the display devices of the above embodiments (e.g., the technical features of the light-emitting units discussed above. These curved display devices are intended to be included within the scope of the present disclosure.

Fifth Embodiment

Fifth Embodiment of the present disclosure also provides some display devices which may avoid or reduce the formation of cracks in the step of using these display devices to form curved display devices.

Figure 7A:
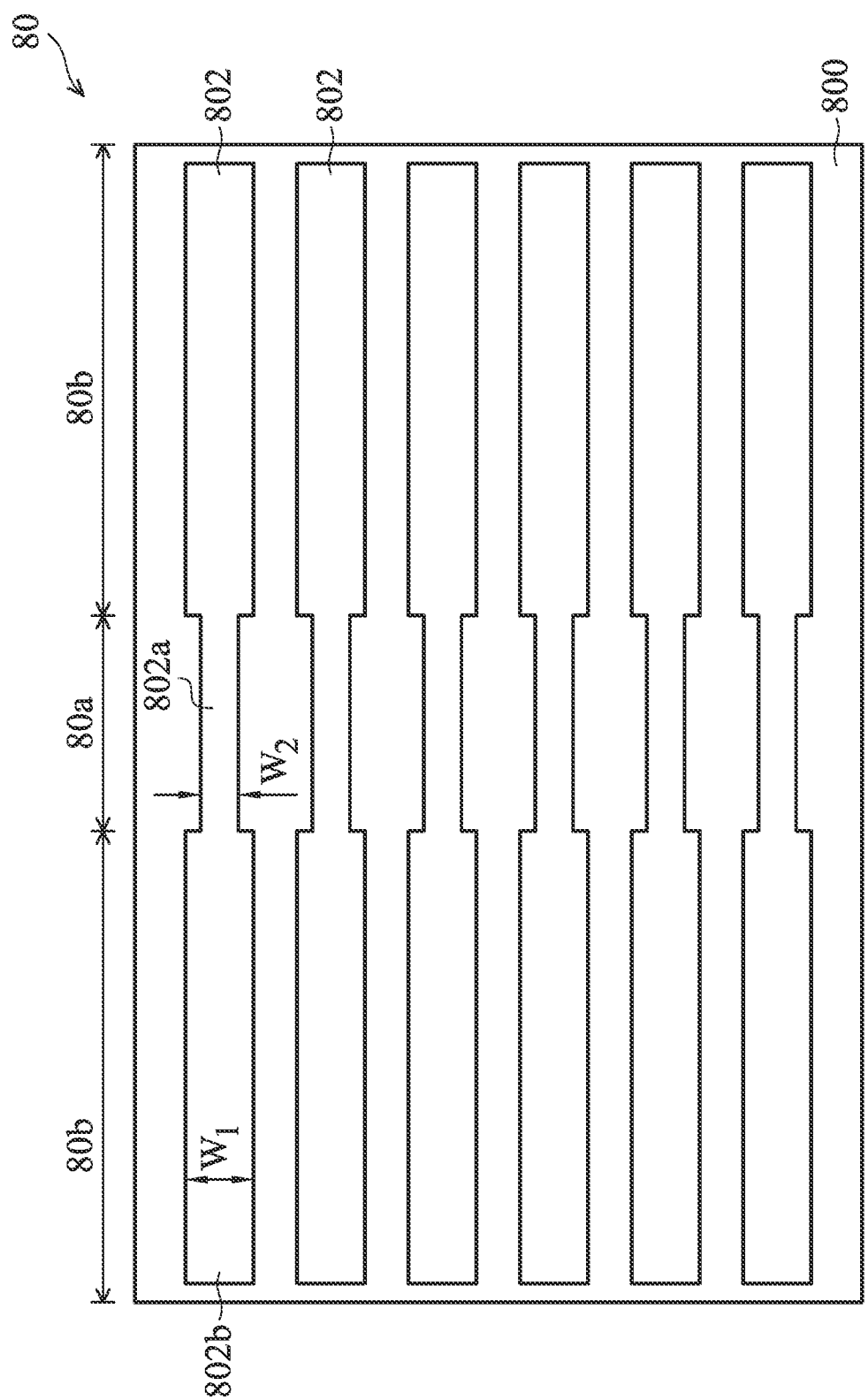
FIG. 7A is a schematic top view of the display device 80 according to Fifth Embodiment of the present disclosure.

Referring to FIG. 7A, a schematic top view of the display device 80 according to Fifth Embodiment of the present disclosure is provided. Although only the substrate 800 and the conductive electrodes (or conductive lines) 802 are shown in FIG. 7A for the interest of simplicity, one skilled in the art can understand that additional layers and/or components discussed in the above embodiments may also be disposed in the display device 80. For example, some light-emitting units or insulating layers may be formed in the display device 80.

For example, the display device 80 can be bent to form a curved display device (e.g., the curved display devices 10 or 10' shown in FIGS. 1A and 1). As shown in FIG. 7A, the display device 80 can include a portion 80a and a portion 80b. For example, the portion 80a can correspond to a curved portion of a curved display device (e.g., the curved portion 100' of the curved display device 10' illustrated in FIG. 1B) formed of the display device 80, and the portion 80b can correspond to a non-curved portion of the curved display device formed of the display device 80.

As shown in FIG. 7A, the conductive electrode (or conductive line) 802 can include a neck portion 802a disposed in the portion 80a of the display device 80, and a portion 802b disposed in the portion 80b of the display device 80. For example, the portion 802a is narrower than the other portions of the conductive electrode (or conductive line) 802. In some embodiments, a width $W_2$ of the portion 802a of the conductive electrode (or conductive line) 802 is smaller than a width $W_1$ of the portion 802b of the conductive electrode (or conductive line) 802, which may avoid or reduce the formation of cracks in the step of using the display device 80 to form a curved display device.

Figure 7B:
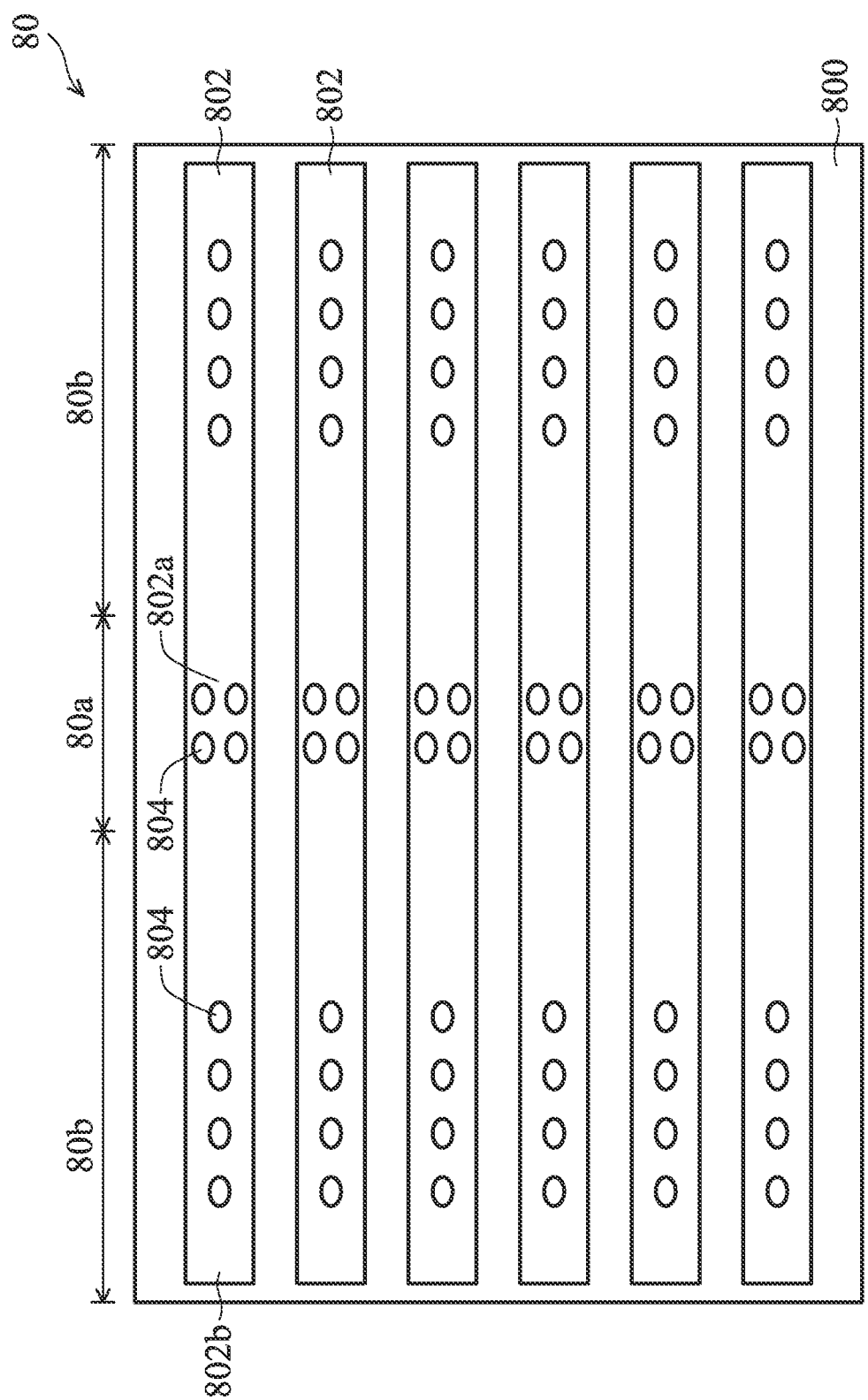
FIG. 7B is a schematic top view of the display device 80 according to some embodiments of the present disclosure.

In some embodiments, as shown in FIG. 7B, the conductive electrode (or conductive line) 802 can include one or more openings 804. The density (e.g., number of openings per unit area) of the openings 804 in the portion 802a of the conductive electrode (or conductive line) 802 and the density of the openings 804 in the portion 802b of the conductive electrode (or conductive line) 802 may be different. For example, the density of the openings 804 in the portion 802a of the conductive electrode (or conductive line) 802 may be greater than the density of the openings 804 in the portion 802b of the conductive electrode (or conductive line) 802, which may avoid or reduce the formation of cracks in the step of using the display device 80 to form a curved display device.

Figure 7C:
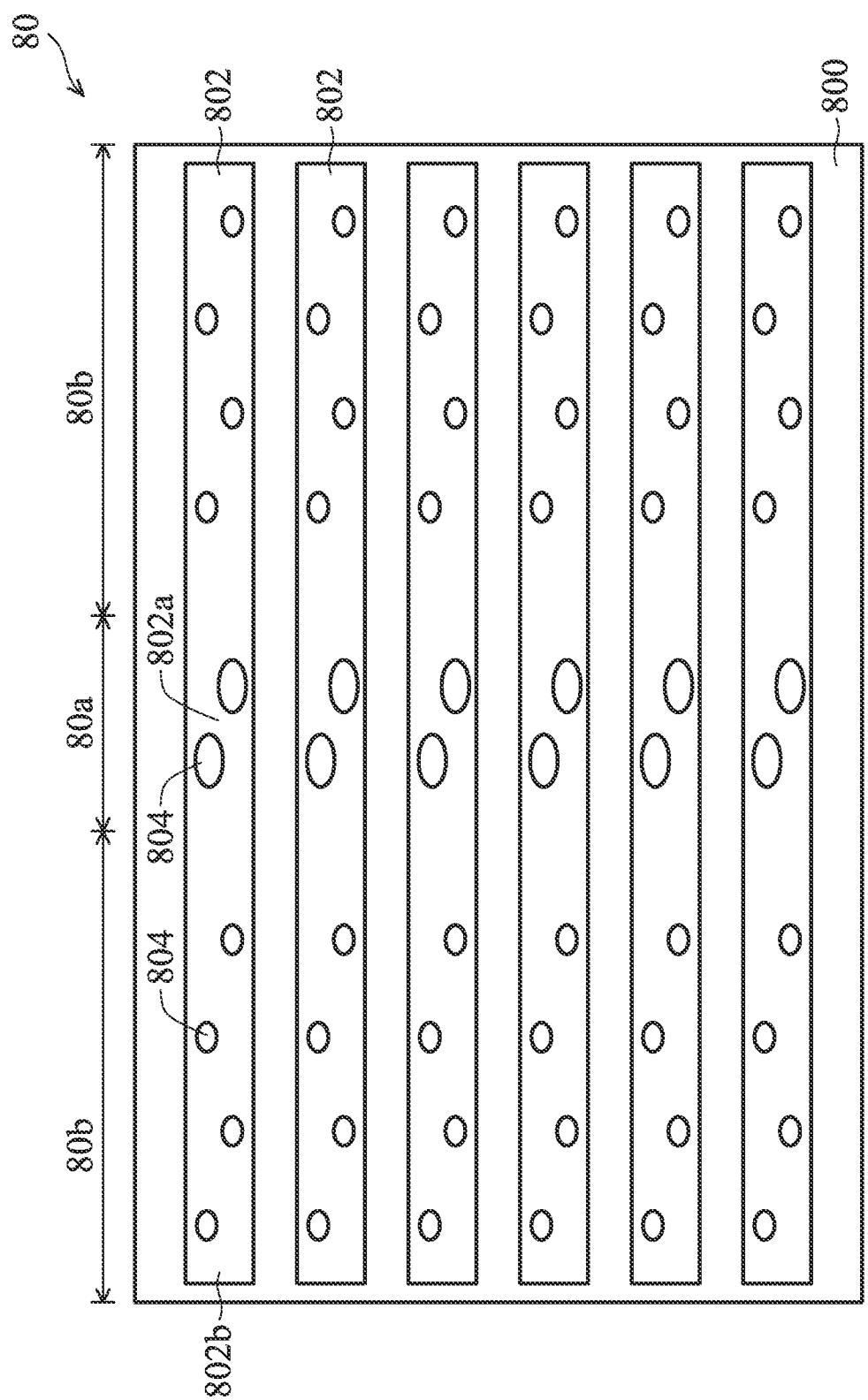
FIG. 7C is a schematic top view of the display device 80 according to some embodiments of the present disclosure.

In some embodiments, as shown in FIG. 7C, the area of one of the openings 804 in the portion 802a of the conductive electrode 802 and the area of one of the openings 804 in the portion 802b of the conductive electrode (or conductive line) 802 may be different. For example, the area of one of the openings 804 in the portion 802a of the conductive electrode (or conductive line) 802 may be greater than the area of one of the openings 804 in the portion 802b of the conductive electrode (or conductive line) 802, which may avoid or reduce the formation of cracks in the step of using the display device 80 to form a curved display device.

It should be noted that the curved display devices formed of the display devices of the above embodiments may include technical features which are the same as or similar to the technical features of the display devices of the above embodiments (e.g., the technical features of the conductive electrodes discussed above. These curved display devices are intended to be included within the scope of the present disclosure.

Understandably, a deposition process, a lithography process, an etching process, other applicable processes, or a combination thereof may be used to form the display devices of the above embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. In addition, each claim can be an individual embodiment of the present disclosure, and the scope of the present disclosure includes the combinations of every claim and every embodiment of the present disclosure.

What is claimed is:

1. A display device, comprising:
    a substrate;
    a light-emitting diode disposed on the substrate;
    an insulating layer disposed on the light-emitting diode;
    a touch electrode disposed on the insulating layer and comprising a plurality of holes in a top view; and
    a conductive electrode disposed on the insulating layer and extending through the insulating layer to electrically connect to the light-emitting diode, wherein the insulating layer comprises a first portion and a second portion adjacent to the first portion, the first portion and the conductive electrode are overlapped, the second portion and the conductive electrode are not overlapped, a thickness of the second portion is greater than a thickness of the first portion, and at least a portion of the conductive electrode is in contact with the insulating layer, wherein the touch electrode comprises a curved portion and a non-curved portion, and an area of one of the holes corresponding to the curved portion is greater than an area of one of the holes corresponding to the non-curved portion.

2. The display device according to claim 1, wherein a top surface of the second portion is higher than a top surface of the light-emitting diode.

3. The display device according to claim 1, wherein the conductive electrode comprises a plurality of openings.

4. The display device according to claim 3, wherein an area of one of the plurality of openings is less than an area of the light-emitting diode.

5. The display device according to claim 3, wherein the conductive electrode further comprises an undulating edge.

6. The display device according to claim 1, further comprising:
    a conductive line disposed on the substrate and electrically connected to the light-emitting diode by the conductive electrode, wherein the conductive line comprises an undulating edge, wherein the conductive line has an extending length, and the extending length is greater than or equal to half of a first distance and is less than or equal to the first distance, wherein the first distance is between a first edge and a second edge opposite to the first edge of the substrate.

7. The display device according to claim 6, wherein the conductive line further comprises a plurality of openings, one of the plurality of openings is directly located between the conductive electrode and another conductive electrode which is directly adjacent to the conductive electrode in a plane view.

8. The display device according to claim 6, wherein the insulating layer further comprises a third portion and a fourth portion adjacent to the third portion, the third portion and the conductive line are overlapped, the fourth portion and the conductive line are not overlapped, and a thickness of the third portion is greater than a thickness of the fourth portion.

9. The display device according to claim 1, wherein the conductive electrode comprises a common electrode, a touch electrode, or a combination thereof.

10. The display device according to claim 1, further comprising:
    a conductive line disposed on the substrate, wherein the conductive line is electrically connected to the light-emitting diode by the conductive electrode, the conductive electrode comprises a plurality of openings, at least one of the plurality of openings has a shape, and the shape has a first curved portion.

11. A display device, comprising:
    a substrate;
    a plurality of light-emitting diodes disposed on the substrate;
    an insulating layer disposed on the plurality of light-emitting diodes;
    a plurality of touch electrodes disposed on the insulating layer, wherein each of the touch electrodes comprises a plurality of holes in a top view; and
    a plurality of conductive electrodes disposed on the substrate and comprising an undulating edge in a top view, wherein the insulating layer comprises a first portion and a second portion adjacent to the first portion, the first portion and at least one of the plurality of conductive electrodes are overlapped, the second portion and the at least one of the plurality of conductive electrodes are not overlapped, a thickness of the second portion is greater than a thickness of the first portion, and at least a portion of one of the conductive electrodes contacts the insulating layer, wherein the touch electrode comprises a curved portion and a non-curved portion, and an area of one of the holes corresponding to the curved portion is greater than an area of one of the holes corresponding to the non-curved portion.

12. The display device according to claim 11, wherein a top surface of the second portion is higher than a top surface of the one of the plurality of light-emitting diode.

13. The display device according to claim 11, wherein one of the plurality of the conductive electrodes comprises a plurality of openings, and an area of one of the plurality of openings is less than an area of one of the plurality of light-emitting diodes.

14. The display device according to claim 13, wherein the one of the plurality of the conductive electrodes further comprises an undulating edge.

15. The display device according to claim 11, further comprising:
    a conductive line disposed on the substrate and electrically connected to at least one of the plurality of light-emitting diodes, wherein the conductive line comprises a plurality of openings.

16. The display device according to claim 15, wherein the conductive line further comprises an undulating edge.

17. The display device according to claim 11, wherein one of the plurality of the conductive electrodes comprises a common electrode, a touch electrode, or a combination thereof.

18. The display device according to claim 11, wherein the plurality of light-emitting diodes are disposed in the curved portion and the non-curved portion of the display device, and a dimension of at least one of the plurality of the light-emitting diodes in the curved portion is less than a dimension of at least one of the plurality of the light-emitting diodes in the non-curved portion.

19. The display device according to claim 11, further comprising:
 a conductive line disposed having a neck portion, wherein the neck portion is narrower than other portions of the conductive line.

20. The display device according to claim 19 wherein the neck portion is disposed corresponding to the curved portion.

* * * * *